(12) United States Patent
Nakajima

(10) Patent No.: US 11,257,556 B2
(45) Date of Patent: Feb. 22, 2022

(54) DATA TRANSFER CIRCUIT, ELECTRONIC COMPONENT, ELECTRONIC APPARATUS, AND VEHICLE

(71) Applicant: Seiko Epson Corporation, Tokyo (JP)

(72) Inventor: Katsuhito Nakajima, Minowa (JP)

(73) Assignee: Seiko Epson Corporation

( * ) Notice: Subject to any disclaimer, the term of this patent is extended or adjusted under 35 U.S.C. 154(b) by 83 days.

(21) Appl. No.: 16/879,916

(22) Filed: May 21, 2020

(65) Prior Publication Data

US 2020/0372964 A1    Nov. 26, 2020

(30) Foreign Application Priority Data

May 22, 2019   (JP) .............................. JP2019-095748

(51) Int. Cl.
    *G11C 17/18*   (2006.01)
(52) U.S. Cl.
    CPC ................................... *G11C 17/18* (2013.01)
(58) Field of Classification Search
    CPC .... G11C 11/18; G11C 11/1006; G11C 11/103
    USPC ...... 365/94, 189.05, 189.17, 185.13, 230.08, 365/230.09
    See application file for complete search history.

(56) References Cited

U.S. PATENT DOCUMENTS

| | | | | |
|---|---|---|---|---|
| 5,526,490 A | * | 6/1996 | Nishikawa | ............ G06F 13/122 709/225 |
| 7,035,956 B2 | * | 4/2006 | Tanaka | .................... G06F 13/28 710/306 |
| 2013/0138943 A1 | * | 5/2013 | Ichimiya | ............. G06F 13/4256 713/2 |

FOREIGN PATENT DOCUMENTS

| | | |
|---|---|---|
| JP | 2006-127245 A | 5/2006 |
| JP | 2006-331221 A | 12/2006 |
| JP | 2018-032672 A | 3/2018 |

\* cited by examiner

*Primary Examiner* — Connie C Yoha
(74) *Attorney, Agent, or Firm* — Harness, Dickey & Pierce, P.L.C.

(57) ABSTRACT

A data transfer circuit includes: a one-time PROM storing first to m-th register addresses and first to m-th register data; first to n-th registers holding first to n-th data corresponding to first to n-th parameters controlling an operation of a functional element; and a data transfer control circuit acquiring the i-th register address and the i-th register data from the one-time PROM, transferring the i-th register data to the k-th register designated by the i-th register address, k being an integer equal to or greater than 1 and equal to or smaller than n, and updating the k-th data with the i-th register data.

10 Claims, 15 Drawing Sheets

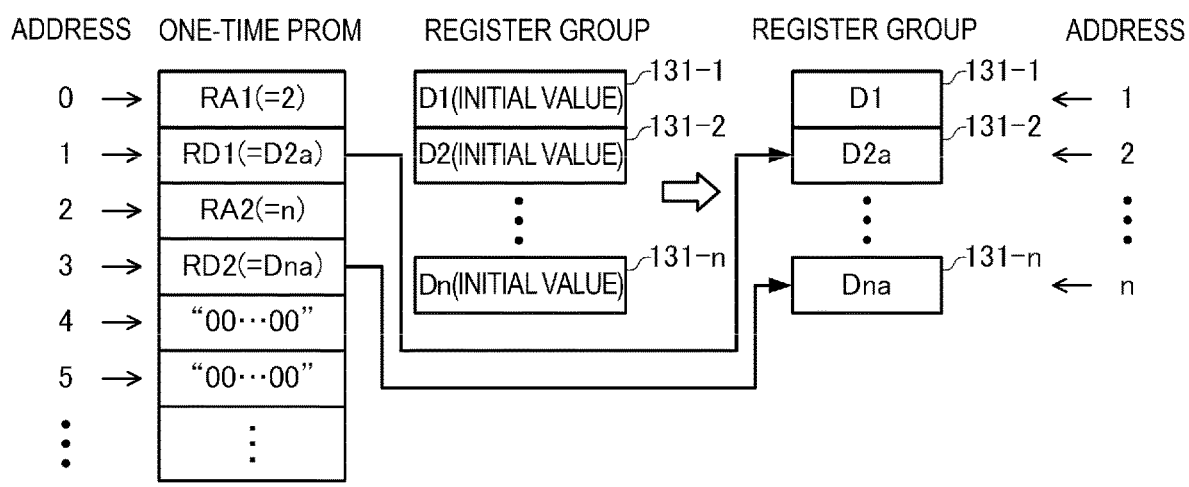

FIG. 10

| ADDRESS | BEFORE FIRST ADJUSTMENT | | BEFORE SECOND ADJUSTMENT | | AFTER ADJUSTMENT IS FINISHED | |
|---|---|---|---|---|---|---|
| 0 → | "00...00" | "00...00" | RA1(=2) | RD1(=D2a) | RA1(=2) | RD1(=D2a) |
| 1 → | "00...00" | "00...00" | "00...00" | "00...00" | RA2(=n) | RD2(=Dna) |
| 2 → | "00...00" | "00...00" | "00...00" | "00...00" | "00...00" | "00...00" |
| 3 → | "00...00" | "00...00" | "00...00" | "00...00" | "00...00" | "00...00" |
| 4 → | "00...00" | "00...00" | "00...00" | "00...00" | "00...00" | "00...00" |
| 5 → | "00...00" | "00...00" | "00...00" | "00...00" | "00...00" | "00...00" |
| ... | ... | ... | ... | ... | ... | ... |

DATA TRANSFER CIRCUIT, ELECTRONIC COMPONENT, ELECTRONIC APPARATUS, AND VEHICLE

The present application is based on, and claims priority from JP Application Serial Number 2019-095748, filed May 22, 2019, the disclosure of which is hereby incorporated by reference herein in its entirety.

BACKGROUND

1. Technical Field

The present disclosure relates to a data transfer circuit, an electronic component, an electronic apparatus, and a vehicle.

2. Related Art

JP-A-2018-32672 discloses a semiconductor integrated circuit in which calibration of temperature characteristics is required and which has an OTP ROM (one-time programmable ROM) where data is written in a data bit string in a first round and where data is written in a flag bit, a data bit string, and a parity bit in a second round. This semiconductor integrated circuit has an error correction circuit executing error correction on the data of the data bit string, based on the data of the parity bit, when the data of the data bit string in the first round and the data of the data bit string in the second round are different from each other, and a sign inversion circuit inverting the sign of the data of the data bit string and the data of the parity bit, based on the data of the flag bit, when the data is written in the flag bit. Therefore, the data bit string written in the OTP ROM can be practically rewritten. Thus, in the semiconductor integrated circuit disclosed in JP-A-2018-32672, the size of the OTP ROM can be reduced.

However, in the semiconductor integrated circuit disclosed in JP-A-2018-32672, once the data is written into the parity bit, the inverted data thereof cannot be written again and therefore the data bit string cannot be rewritten twice or more. Therefore, when a parameter stored in the OTP ROM needs to be rewritten a plurality of times in a parameter adjustment process, the semiconductor integrated circuit disclosed in JP-A-2018-32672 cannot be employed.

SUMMARY

A data transfer circuit according to an aspect of the present disclosure includes: a one-time programmable read-only memory (PROM) storing first to m-th register addresses and first to m-th register data, m being an integer equal to or greater than 1; first to n-th registers holding first to n-th data corresponding to first to n-th parameters controlling an operation of a functional element, n being an integer equal to or greater than 2; and a data transfer control circuit acquiring, with respect to each integer i equal to or greater than 1 and equal to or smaller than m, the i-th register address and the i-th register data from the one-time PROM, the data transfer control circuit transferring the i-th register data to the k-th register designated by the i-th register address, k being an integer equal to or greater than 1 and equal to or smaller than n, the data transfer control circuit updating the k-th data with the i-th register data.

In the data transfer circuit according to the aspect, the one-time PROM may store first to n-th initial data which are initial values of the first to n-th parameters. The data transfer control circuit may transfer the i-th register data to the k-th register after acquiring the first to n-th initial data from the one-time PROM and transferring the first to n-th initial data to the first to n-th registers.

In the data transfer circuit according to the aspect, the data transfer control circuit may transfer the i-th register data to the k-th register after first to n-th initial data which are initial values of the first to n-th parameters are loaded in parallel to the first to n-th registers.

In the data transfer circuit according to the aspect, the one-time PROM may store predetermined data. The data transfer control circuit may determine that transfer of the first to m-th register data is finished, on acquiring the predetermined data from the one-time PROM.

In the data transfer circuit according to the aspect, an address of an area where the i-th register address is stored and an address of an area where the i-th register data is stored, in the one-time PROM, may be different from each other.

In the data transfer circuit according to the aspect, an address of an area where the i-th register address is stored and an address of an area where the i-th register data is stored in the one-time PROM may be the same.

In the data transfer circuit according to the aspect, the functional element may be a resonator element. The data transfer circuit may have an oscillation circuit oscillating the resonator element. One of the first to n-th parameters may be a temperature compensation parameter for the oscillation circuit. Another one of the first to n-th parameters may be a frequency adjustment parameter for the oscillation circuit.

An electronic component according to another aspect of the present disclosure includes: the data transfer circuit according to the foregoing aspect; and the functional element.

An electronic apparatus according to still another aspect of the present disclosure includes: the electronic component according to the foregoing aspect; and a processing circuit operating based on an output signal from the electronic component.

A vehicle according to still another aspect of the present disclosure includes: the electronic component according to the foregoing aspect; and a processing circuit operating based on an output signal from the electronic component.

BRIEF DESCRIPTION OF THE DRAWINGS

FIG. 6 illustrates adjustment of a parameter in a second embodiment.

FIG. 7 shows an example of data transfer in the second embodiment.

FIG. 10 illustrates adjustment of a parameter in a third embodiment.

DESCRIPTION OF EXEMPLARY EMBODIMENTS

Preferred embodiments of the present disclosure will now be described in detail with reference to the drawings. However, the embodiments described below do not unduly limit the content of the present disclosure described in the appended claims. Not all the configurations described below are necessarily essential configurations of the present disclosure.

1. Electronic Component

1-1. First Embodiment

Figure 1:
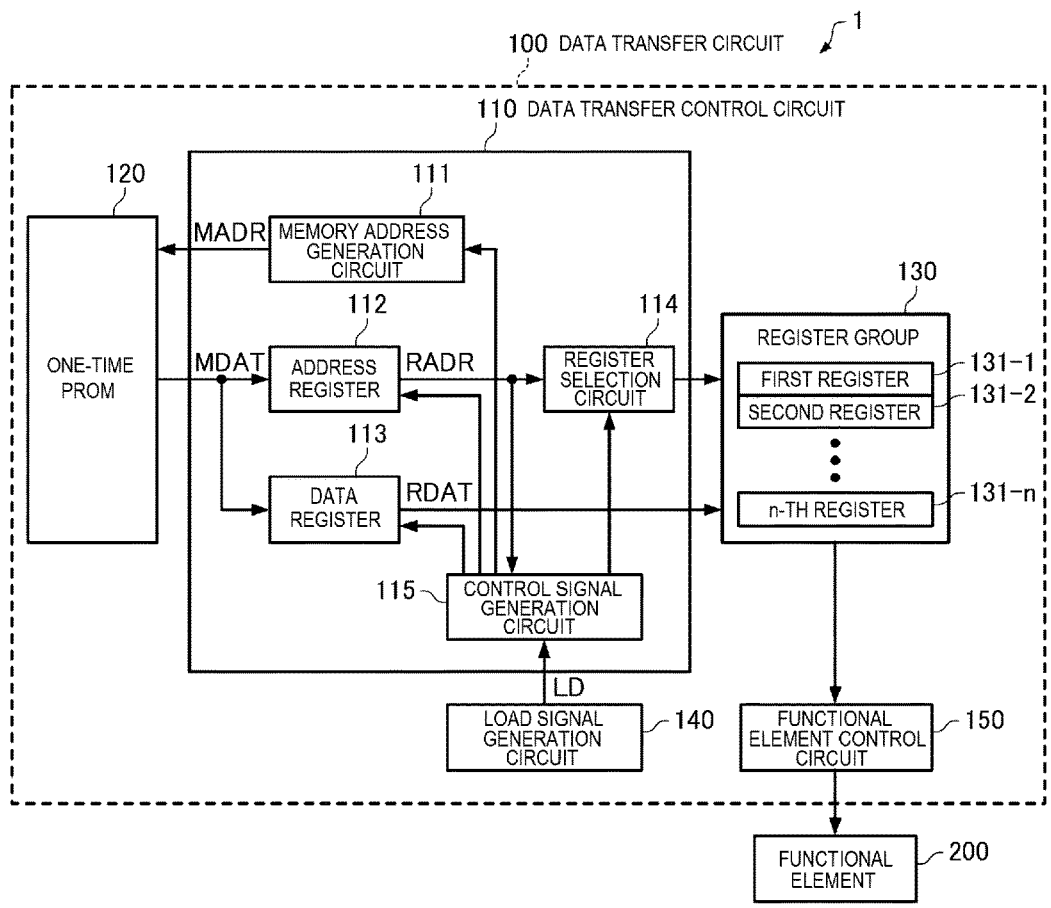
FIG. 1 is a functional block diagram of an electronic component according to an embodiment.

FIG. 1 is a functional block diagram of an electronic component according to this embodiment. As shown in FIG. 1, an electronic component 1 according to this embodiment has a data transfer circuit 100 and a functional element 200. The data transfer circuit 100 may be an integrated circuit.

The functional element 200 is an element having a predetermined function. The functional element 200 may be, for example, a resonator element having the function of oscillating at a desired frequency, or a physical quantity detection element having the function of detecting a desired physical quantity.

The data transfer circuit 100 has a data transfer control circuit 110, a one-time PROM (programmable read-only memory) 120, and a register group 130 including n registers from a first register 131-1 to an n-th register 131-$n$. Here, n is an integer equal to or greater than 2.

The first to n-th registers 131-1 to 131-$n$ hold first to n-th data corresponding to first to n-th parameters controlling the operation of the functional element 200.

The data transfer circuit 100 may have a functional element control circuit 150. The functional element control circuit 150 controls the operation of the functional element 200, based on the first to n-th data held by the first to n-th registers 131-1 to 131-$n$. When the functional element 200 is, for example, a resonator element, the functional element control circuit 150 may control the oscillation frequency and temperature or the like of the functional element 200, based on the first to n-th data. Meanwhile, when the functional element 200 is, for example, a physical quantity detection element, the functional element control circuit 150 may control the detection sensitivity or the like of the functional element 200, based on the first to n-th data.

The one-time PROM 120 is a non-volatile memory that is rewritable only once at each address. The one-time PROM 120 stores first to m-th register addresses and first to m-th register data. Here, m is an integer equal to or greater than 1. In this embodiment, the address of an area where an i-th register address is stored and the address of an area where i-th register data is stored, in the one-time PROM 120, are different from each other, with respect to each integer i equal to or greater than 1 and equal to or smaller than m. In this embodiment, the one-time PROM 120 also stores first to n-th initial data which are initial values of first to n-th parameters.

For example, the first to n-th initial data may be stored in order from the start address, that is, at addresses 0 to n−1 in the one-time PROM 120. The first register address, the first register data, the second register address, the second register data, . . . , the m-th register address, and the m-th register data may be stored in this order at addresses n to n+m−1 in the one-time PROM 120.

The data transfer control circuit 110 performs control to transfer data stored in the one-time PROM 120 to the register group 130. Specifically, the data transfer control circuit 110 acquires the i-th register address and the i-th register data from the one-time PROM 120 with respect to each integer i equal to or greater than 1 and equal to or smaller than m. The data transfer control circuit 110 transfers the i-th register data to a k-th register 131-$k$ designated by the i-th register address. The data transfer control circuit 110 updates k-th data with the i-th register data. Here, k is an integer equal to or greater than 1 and equal to or smaller than n. Particularly, in this embodiment, the data transfer control circuit 110 acquires the first to n-th initial data from the one-time PROM 120, transfers the first to n-th initial data to the first to n-th registers 131-1 to 131-$n$, and subsequently transfers the i-th register data to the k-th register 131-$k$.

In this embodiment, the one-time PROM 120 stores predetermined data, and the data transfer control circuit 110 determines that the transfer of the first to m-th register data is finished, on acquiring the predetermined data from the one-time PROM 120. The predetermined data is data having a different value from the n addresses allocated to the first to n-th registers 131-1 to 131-$n$. When data acquired at a predetermined timing from the one-time PROM 120 is not the predetermined data, the data transfer control circuit 110 determines that the data is the i-th register address, and transfers the i-th register data to the k-th register 131-$k$. When the acquired data is the predetermined data, the data transfer control circuit 110 determines that the transfer of the first to m-th register data is finished.

The data transfer circuit 100 may have a load signal generation circuit 140. The load signal generation circuit 140 generates a load signal LD instructing the data transfer control circuit 110 to start data transfer from the one-time PROM 120 to the register group 130. For example, the load signal generation circuit 140 may generate the load signal LD based on a power-on reset signal, not illustrated, or may generate the load signal LD on receiving a predetermined command via an interface circuit, not illustrated. On receiving the load signal LD, the data transfer control circuit 110 starts data transfer from the one-time PROM 120 to the register group 130.

As shown in FIG. 1, the data transfer control circuit 110 may include a memory address generation circuit 111, an address register 112, a data register 113, a register selection circuit 114, and a control signal generation circuit 115.

On receiving the load signal LD, the control signal generation circuit 115 controls the operation of the memory address generation circuit 111, the address register 112, the data register 113, and the register selection circuit 114.

Under the control of the control signal generation circuit 115, the memory address generation circuit 111 generates a memory address MADR designating an address in the one-time PROM 120, at a predetermined timing. The one-time PROM 120 outputs the data stored at the address designated by the memory address MADR, as memory data MDAT. In this embodiment, the memory address MADR is incremented by 1 each from 0 at a predetermined timing. The one-time PROM 120 outputs data in order from the data stored at the address 0, as the memory data MDAT.

The address register 112 is a register which, under the control of the control signal generation circuit 115, sequentially holds the n addresses allocated to the first to n-th registers 131-1 to 131-n at a predetermined timing and also sequentially holds the first to m-th register addresses stored in the one-time PROM 120.

The data register 113 is a register which, under the control of the control signal generation circuit 115, sequentially holds the first to n-th initial data and the first to m-th register data stored in the one-time PROM 120 at a predetermined timing.

The register selection circuit 114, under the control of the control signal generation circuit 115, selects a j-th register 131-j to which an address designated by a register address RADR held by the address register 112 is allocated, at a predetermined timing. Here, j is an integer equal to or greater than 1 and equal to or smaller than n. Register data RDAT held by the data register 113 is transferred to the j-th register 131-j selected by the register selection circuit 114.

Figure 2:
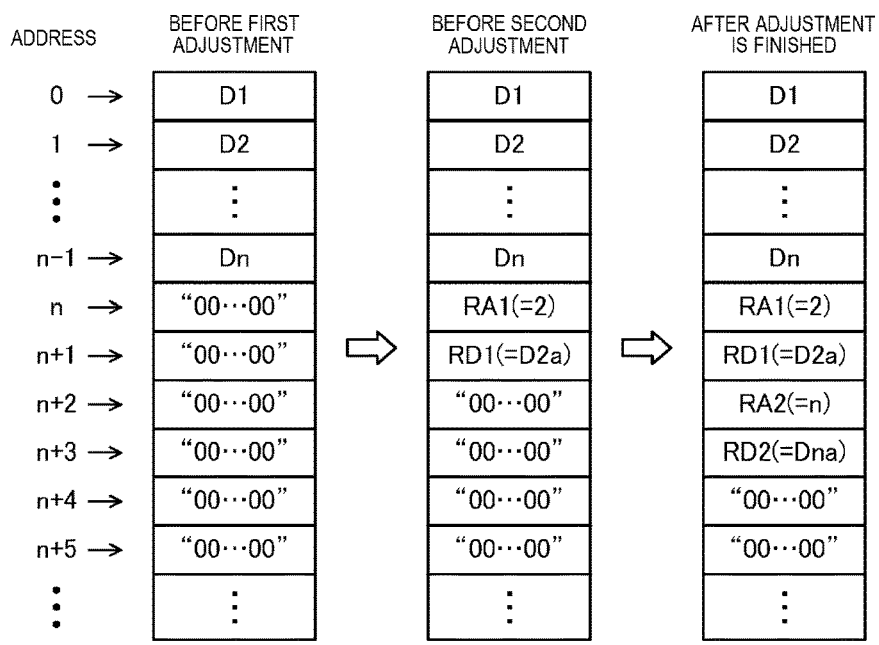
FIG. 2 illustrates adjustment of a parameter in a first embodiment.

In this embodiment, the first to n-th parameters are adjusted in an inspection process at the time of manufacturing the electronic component 1. FIG. 2 illustrates the adjustment of the first to n-th parameters.

In the example in FIG. 2, before the first adjustment, first to n-th initial data D1 to Dn are stored at addresses 0 to n−1 in the one-time PROM 120. In the first adjustment, the first to n-th parameters are set to the first to n-th initial data D1 to Dn. The first to n-th initial data D1 to Dn are, for example, representative values decided at the time of designing or evaluating the electronic component 1 and are written at the addresses 0 to n−1 in the one-time PROM 120 before the first adjustment.

All-0, which is the predetermined data, is stored at the address n onward in the one-time PROM 120. In the example in FIG. 2, the storage area where no writing is done in the one-time PROM 120 has all-0. That is, in the first adjustment, data cannot be rewritten at the address 0 to n−1 in the one-time PROM 120 but data can be written at the address n onward. The n addresses 1 to n are allocated to the first to n-th registers 131-1 to 131-n, respectively. The predetermined data, which is all-0, is different from any of the n addresses 1 to n.

When the second parameter should be changed from the second initial data D2 to data D2a as a result of the first adjustment, a first register address RA1 representing the address 2 allocated to the second register 131-2 is written at the first writable address n in the one-time PROM 120. Also, first register data RD1 representing the data D2a is written at the next writable address n+1 in the one-time PROM 120.

Consequently, before the second adjustment, the first to n-th initial data D1 to Dn are stored at the addresses 0 to n−1 in the one-time PROM 120. The first register address RA1 is stored at the address n. The first register data RD1 is stored at the address n+1. Meanwhile, all-0, which is the predetermined data, is stored at the address n+2 onward in the one-time PROM 120.

When the n-th parameter should be changed from the n-th initial data Dn to data Dna as a result of the second adjustment, a second register address RA2 representing the address n allocated to the n-th register 131-n is written at the first writable address n+2 in the one-time PROM 120. Also, second register data RD2 representing the data Dna is written at the next writable address n+3 in the one-time PROM 120.

In the example in FIG. 2, after the adjustment is finished as the second adjustment is finished, the first to n-th initial data D1 to Dn are stored at the addresses 0 to n−1 in the one-time PROM 120. The first register address RA1 is stored at the address n. The first register data RD1 is stored at the address n+1. The second register address RA2 is stored at the address n+2. The second register data RD2 is stored at the address n+3. Meanwhile, all-0, which is the predetermined data, is stored at the address n+4 onward in the one-time PROM 120.

In the example in FIG. 2, after the adjustment is finished, the two register addresses RA1, RA2 and the two register data RD1, RD2 are stored in the one-time PROM 120 and therefore the integer m is 2.

Figure 3:
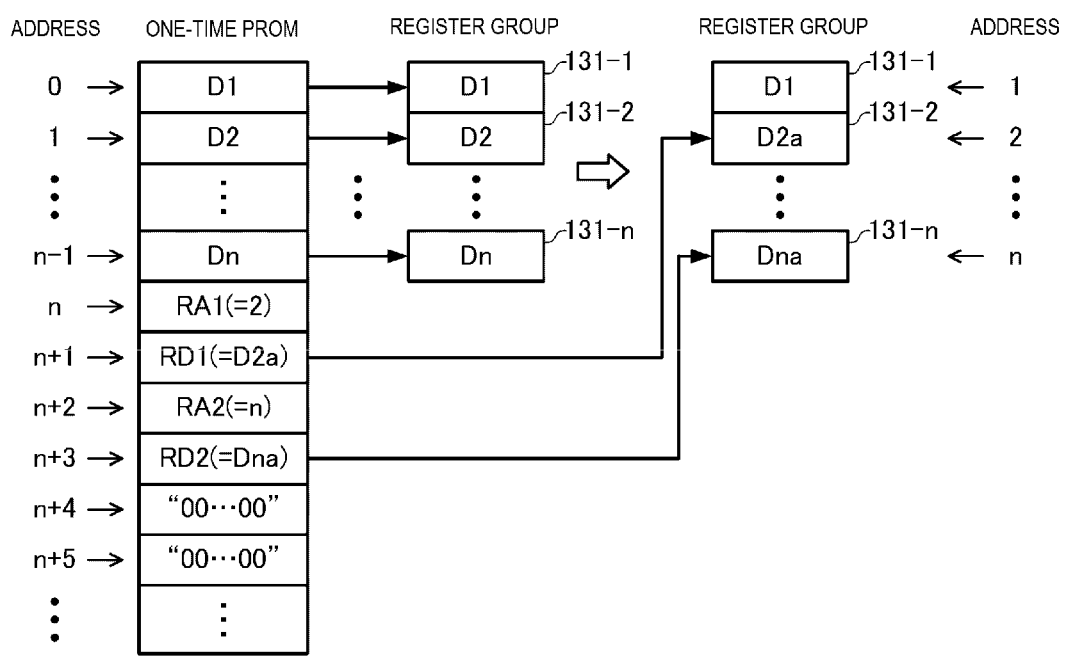
FIG. 3 shows an example of data transfer in the first embodiment.

FIG. 3 shows an example of data transfer from the one-time PROM 120 to the register group 130 by the data transfer control circuit 110. In the example in FIG. 3, the content in the one-time PROM 120 is the same as the content after the adjustment in FIG. 2 is finished.

In the example in FIG. 3, the data transfer control circuit 110, on receiving the load signal LD, sequentially transfers the first to n-th initial data D1 to Dn stored at the addresses 0 to n−1 in the one-time PROM 120 to the first to n-th registers 131-1 to 131-n. The first to n-th parameters are thus initialized to the first to n-th initial data D1 to Dn.

Subsequently, the data transfer control circuit 110 transfers the data D2a, which is the first register data RD1, stored at the address n+1 in the one-time PROM 120, to the second register 131-2, to which the address 2 represented by the first register address RA1 stored at the address n in the one-time PROM 120 is allocated. The second parameter is thus updated to the data D2a. In this data transfer, the integer i is 1 and the integer k is 2.

Subsequently, the data transfer control circuit 110 transfers the data Dna, which is the second register data RD2, stored at the address n+3 in the one-time PROM 120, to the n-th register 131-n, to which the address n represented by the second register address RA2 stored at the address n+2 in the one-time PROM 120 is allocated. The n-th parameter is thus updated to the data Dna. In this data transfer, the integer i is 2 and the integer k is n.

The data transfer control circuit 110 then acquires the all-0, which is the predetermined data, stored at the address n+4 in the one-time PROM 120, and ends the data transfer from the one-time PROM 120 to the register group 130. Subsequently, the electronic component 1 operates in the state where the functional element 200 is controlled by the first to n-th parameters held by the first to n-th registers 131-1 to 131-n.

Figure 4:
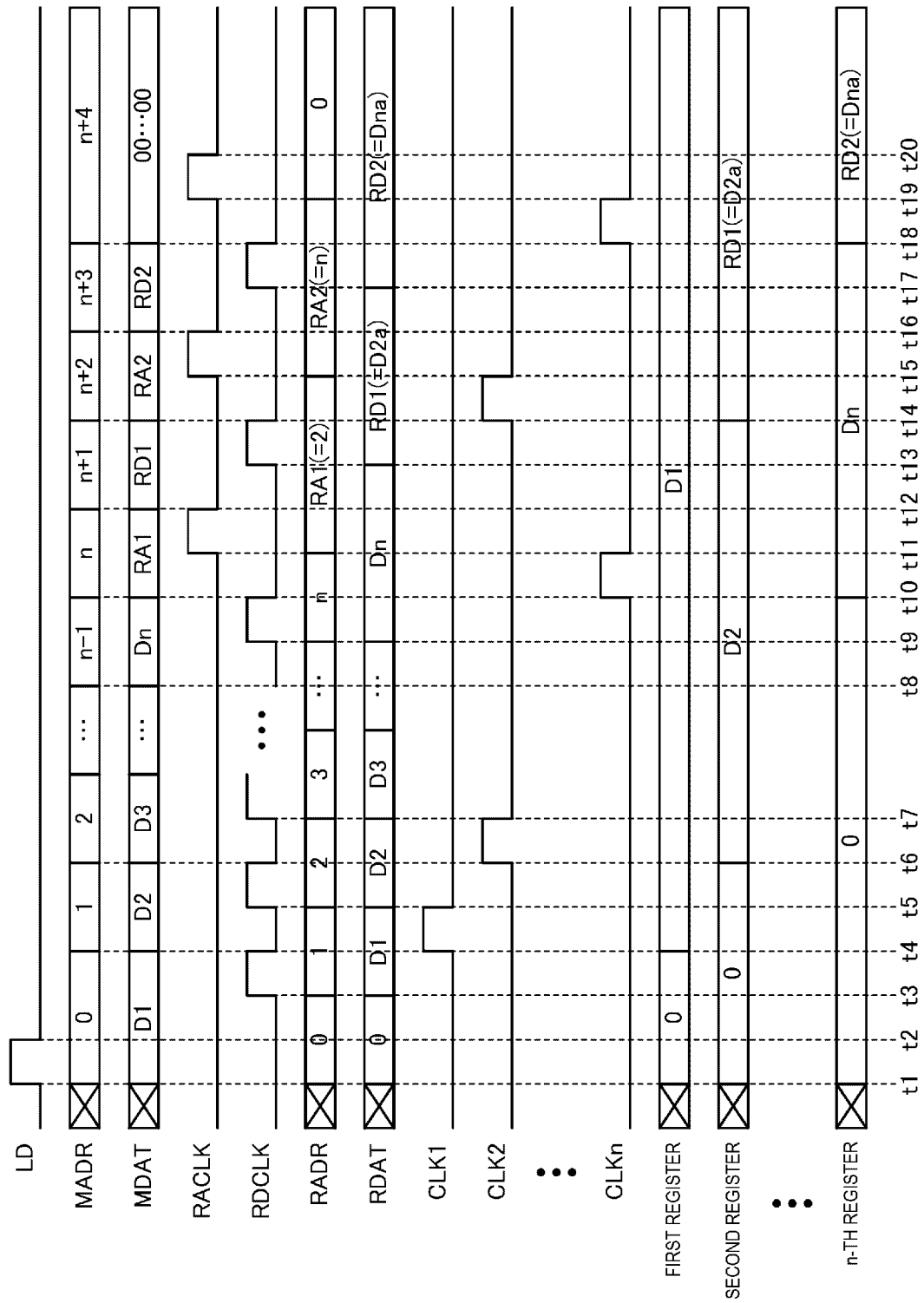
FIG. 4 shows an example of a timing chart of data transfer in the first embodiment.

FIG. 4 shows an example of a timing chart of various signals in the data transfer shown in FIG. 3.

In the example in FIG. 4, at time t1, the load signal LD changes from low level to high level. Thus, the memory address MADR outputted from the memory address generation circuit 111 is initialized to 0, and the first initial data D1 stored at the address 0 is outputted as the memory data MDAT from the one-time PROM 120. Also, the register address RADR held by the address register 112 and the register data RDAT held by the data register 113 are initialized to 0. The data held by the first to n-th registers 131-1 to 131-n are initialized to 0.

At time t2, the load signal LD changes from high level to low level. Thus, at time t3, a clock signal RDCLK changes from low level to high level. A clock signal RACLK does not change and stays at low level. The clock signal RACLK is a clock signal for the address register 112 to take in the memory data MDAT. The clock signal RDCLK is a clock signal for the data register 113 to take in the memory data MDAT.

At time t3, the register address RADR is incremented from 0 to 1. Also, the memory data MDAT is taken into the data register 113 and the register data RDAT becomes the first initial data D1, synchronously with the rise of the clock signal RDCLK from low level to high level at time t3.

At time t4, the memory address MADR is incremented from 0 to 1 and the second initial data D2 stored at the address 1 is outputted as the memory data MDAT from the one-time PROM 120. Also, the clock signal RDCLK changes from high level to low level. A clock signal CLK1 changes from low level to high level. A clock signal CLK2 does not change and stays at low level. The clock signals CLK1 to CLKn are clock signals for the first to n-th registers 131-1 to 131-n to take in the register data RDAT, respectively.

The register data RDAT is taken into the first register 131-1 and the first parameter is initialized to the first initial data D1, synchronously with the rise of the clock signal CLK1 from low level to high level at time t4.

At time t5, the register address RADR is incremented from 1 to 2. Also, the clock signal RDCLK changes from low level to high level. The memory data MDAT is taken into the data register 113 and the register data RDAT becomes the second initial data D2, synchronously with the rise of the clock signal RDCLK. The clock signal CLK1 changes from high level to low level.

At time t6, the memory address MADR is incremented from 1 to 2 and the third initial data D3 stored at the address 1 is outputted as the memory data MDAT from the one-time PROM 120. Also, the clock signal RDCLK changes from high level to low level. The clock signal CLK2 changes from low level to high level. The register data RDAT is taken into the second register 131-2 and the second parameter is initialized to the second initial data D2, synchronously with the rise of the clock signal CLK2.

At time t7, the register address RADR is incremented from 2 to 3. Also, the clock signal RDCLK changes from low level to high level. The memory data MDAT is taken into the data register 113 and the register data RDAT becomes the third initial data D3, synchronously with the rise of the clock signal RDCLK. The clock signal CLK2 changes from high level to low level.

At time t7 onward, the third to (n−1)th parameters are similarly initialized to the third to (n−1)th initial data D3 to Dn−1, respectively. At time t8, the memory address MADR is incremented from n−1 to n and the n-th initial data Dn stored at the address n−1 is outputted as the memory data MDAT from the one-time PROM 120.

At time t9, the register address RADR is incremented from n−1 to n. Also, the clock signal RDCLK changes from low level to high level. The memory data MDAT is taken into the data register 113 and the register data RDAT becomes the n-th initial data Dn, synchronously with the rise of the clock signal RDCLK.

At time t10, the memory address MADR is incremented from n−1 to n and the first register address RA1 stored at the address n is outputted as the memory data MDAT from the one-time PROM 120. Also, the clock signal RDCLK changes from high level to low level. The clock signal CLKn changes from low level to high level. The register data RDAT is taken into the n-th register 131-n and the n-th parameter is initialized to the n-th initial data Dn, synchronously with the rise of the clock signal CLKn.

At time t11, the clock signal RACLK changes from low level to high level. The memory data MDAT is taken into the address register 112 and the register address RADR becomes the first register address RA1, synchronously with the rise of the clock signal RACLK. Also, the clock signal CLKn changes from high level to low level.

At time t12, the memory address MADR is incremented from n to n+1 and the first register data RD1 stored at the address n+1 is outputted as the memory data MDAT from the one-time PROM 120. Also, the clock signal RACLK changes from high level to low level.

At time t13, the clock signal RDCLK changes from low level to high level. The memory data MDAT is taken into the data register 113 and the register data RDAT becomes the first register data RD1, synchronously with the rise of the clock signal RDCLK.

At time t14, the memory address MADR is incremented from n+1 to n+2 and the second register address RA2 stored at the address n+2 is outputted as the memory data MDAT from the one-time PROM 120. Also, the clock signal RDCLK changes from high level to low level. Since the first register address RA1, which is the register address RADR, is 2, the clock signal CLK2 changes from low level to high level. The register data RDAT is taken into the second register 131-2 and the second parameter is updated to the data D2a, which is the first register data RD1, synchronously with the rise of the clock signal CLK2.

At time t15, the clock signal RACLK changes from low level to high level. The memory data MDAT is taken into the address register 112 and the register address RADR becomes the second register address RA2, synchronously with the rise of the clock signal RACLK. Also, the clock signal CLK2 changes from high level to low level.

At time t16, the memory address MADR is incremented from n+2 to n+3 and the second register data RD2 stored at the address n+3 is outputted as the memory data MDAT from the one-time PROM 120. Also, the clock signal RACLK changes from high level to low level.

At time t17, the clock signal RDCLK changes from low level to high level. The memory data MDAT is taken into the data register 113 and the register data RDAT becomes the second register data RD2, synchronously with the rise of the clock signal RDCLK.

At time t18, the memory address MADR is incremented from n+3 to n+4, and the all-0, which is the predetermined data, stored at the address n+4 is outputted as the memory data MDAT from the one-time PROM 120. Also, the clock signal RDCLK changes from high level to low level. Since the second register address RA2, which is the register address RADR, is n, the clock signal CLKn changes from low level to high level. The register data RDAT is taken into the n-th register 131-n and the n-th parameter is updated to the data Dna, which is the second register data RD2, synchronously with the rise of the clock signal CLKn.

At time t19, the clock signal RACLK changes from low level to high level. The memory data MDAT is taken into the address register 112 and the register address RADR becomes 0, synchronously with the rise of the clock signal RACLK. Also, the clock signal CLKn changes from high level to low level.

At time t20, the clock signal RACLK changes from high level to low level. Since the register address RADR is 0, the data transfer from the one-time PROM 120 to the register group 130 ends.

Figure 5:
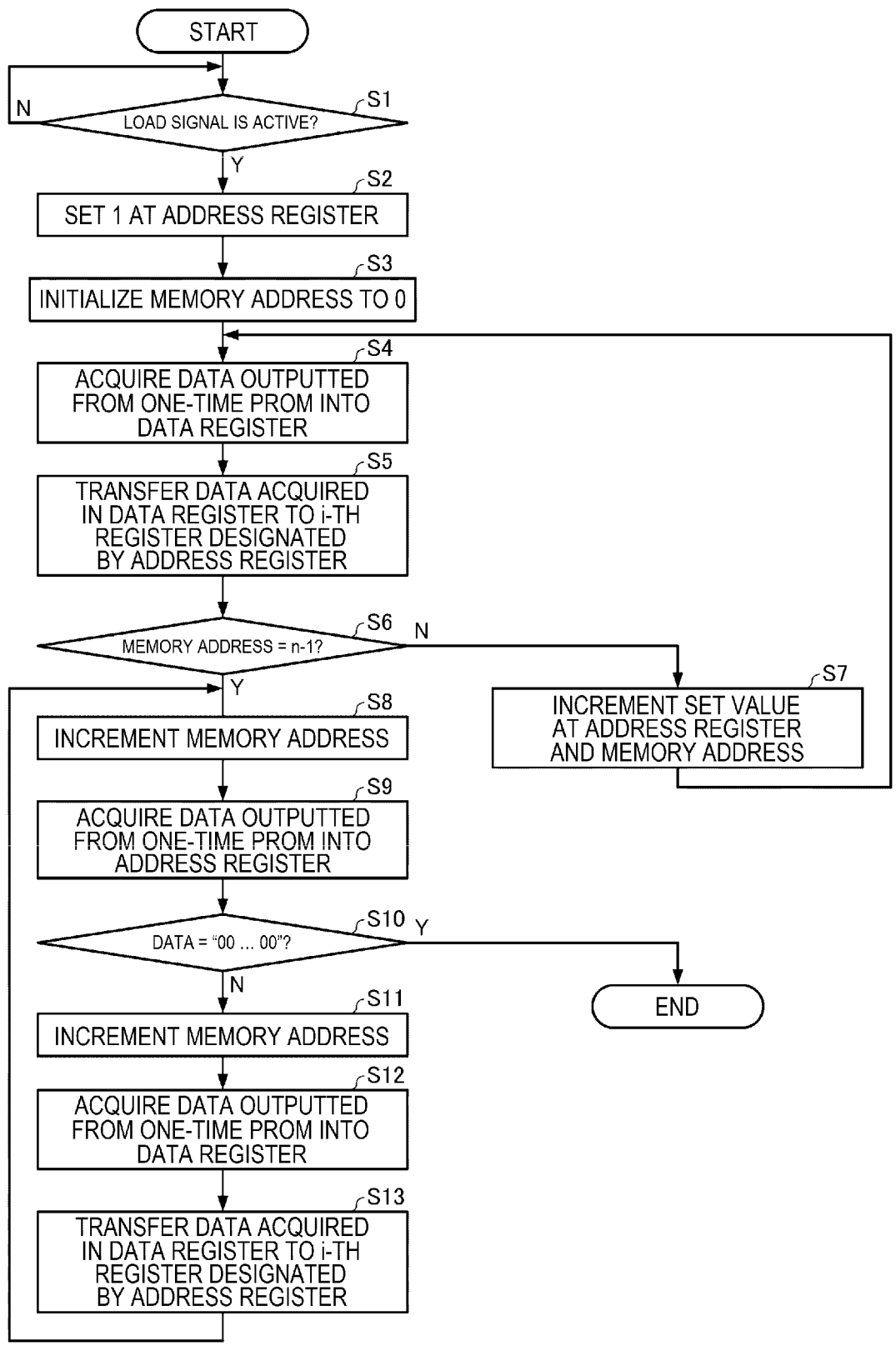
FIG. 5 is a flowchart showing an example of procedures of data transfer in the first embodiment.

FIG. 5 is a flowchart showing an example of processing procedures by the data transfer control circuit 110.

As shown in FIG. 5, the data transfer control circuit 110 waits until the load signal LD turns active (N in step S1). The load signal LD is active, for example, when it is at high level.

When the load signal LD is active (Y in step S1), the data transfer control circuit 110 first sets 1 at the address register 112 (step S2). Thus, the register address RADR becomes 1.

Next, the data transfer control circuit 110 initializes the memory address MADR to 0 (step S3) and acquires the memory data MDAT outputted from the one-time PROM 120 into the data register 113 (step S4). Thus, the register data RDAT becomes the first initial data D1.

Next, the data transfer control circuit 110 transfers the data acquired in the data register 113 to the first register 131-1 designated by the address register 112 (step S5). Thus, the first parameter is initialized to the first initial data D1.

Next, when the memory address MADR is not n−1 (N in step S6), the data transfer control circuit 110 increments the set value at the address register 112 and the memory address MADR (step S7). Thus, the register address RADR becomes 2 and the memory address MADR becomes 1. Then, the processing in steps S4 to S5 is carried out again and the second parameter is initialized to the second initial data D2.

The data transfer control circuit 110 repeats the processing in steps S4 to S7 until the memory address MADR becomes n−1. Thus, the first to n-th parameters are initialized to the first to n-th initial data D1 to Dn, respectively.

When the memory address MADR is n−1 (Y in step S6), the data transfer control circuit 110 increments the memory address MADR (step S8) and acquires the memory data MDAT outputted from the one-time PROM 120 into the address register 112 (step S9). Thus, the memory address MADR becomes n and the register address RADR becomes the first register address RA1.

Next, when the data acquired into the address register 112 is not all-0, which is the predetermined data (N in step S10), the data transfer control circuit 110 increments the memory address MADR (step S11) and acquires the memory data MDAT outputted from the one-time PROM 120 into the data register 113 (step S12). Thus, the memory address MADR becomes n+1 and the register data RDAT becomes the first register data RD1.

Next, the data transfer control circuit 110 transfers the data acquired in the data register 113 to the i-th register 131-$i$ designated by the address register 112 (step S13). Thus, the i-th parameter is updated to the first register data RD1.

The data transfer control circuit 110 repeats the processing in step S8 onward. When the data acquired into the address register 112 in step S9 is all-0, which is the predetermined data (Y in step S10), the data transfer control circuit 110 ends the processing.

As described above, the electronic component 1 according to the first embodiment has the data transfer circuit 100 and the functional element 200. The data transfer circuit 100 has the one-time PROM 120 storing the first to m-th register addresses RA1 to RAm and the first to m-th register data RD1 to RDm, the first to n-th registers 131-1 to 131-$n$ holding the first to n-th data corresponding to the first to n-th parameters controlling the operation of the functional element 200, and the data transfer control circuit 110 acquiring the i-th register address RAi and the i-th register data RDi from the one-time PROM 120, transferring the i-th register data RDi to the k-th register 131-$k$ designated by the i-th register address RAi, and updating the k-th data with the i-th register data RDi. Therefore, in the electronic component 1 or the data transfer circuit 100 according to the first embodiment, in the process of adjusting the first to n-th parameters, the i-th register address RAi and the i-th register data RDi are written at a new address in the one-time PROM 120 every time the k-th parameter needs to be rewritten. This enables the k-th parameter to be rewritten practically a plurality of times. Also, in the electronic component 1 or the data transfer circuit 100 according to the first embodiment, in the process of adjusting the first to n-th parameters, a new register address and register data need not be written with respect to a parameter that needs no rewriting. Therefore, the size of the one-time PROM 120 can be reduced.

In the electronic component 1 according to the first embodiment, the one-time PROM 120 stores the first to n-th initial data, which are initial values of the first to n-th parameters. The data transfer control circuit 110 acquires the first to n-th initial data from the one-time PROM 120, transfers the first to n-th initial data to the first to n-th registers 131-1 to 131-$n$, and subsequently transfers the i-th register data to the k-th register 131-$k$. Thus, in the electronic component 1 or the data transfer circuit 100 according to the first embodiment, the one-time PROM 120 need not store n register addresses designating the transfer destinations of the first to n-th initial data. Therefore, the size of the one-time PROM 120 can be reduced further.

In the electronic component 1 according to the first embodiment, the one-time PROM 120 stores the predetermined data. The data transfer control circuit 110, on acquiring the predetermined data from the one-time PROM 120, determines that transfer of the first to m-th register data is finished. Therefore, in the electronic component 1 or the data transfer circuit 100 according to the first embodiment, the data transfer control circuit 110 need not learn the number of register data to be transferred from the one-time PROM 120 to the first to n-th registers 131-1 to 131-$n$, and a counter to count the number of transferred register data is not needed. This can simplify the configuration of the data transfer control circuit 110.

In the electronic component 1 according to the first embodiment, the address of the area where the i-th register address is stored and the address of the area where the i-th register data is stored, in the one-time PROM 120, are different from each other, with respect to each integer i equal to or greater than 1 and equal to or smaller than m. Therefore, in the electronic component 1 or the data transfer circuit 100 according to the first embodiment, the number of bits of each address can be made fewer than in the case where the address of the area where the i-th register address is stored and the address of the area where the i-th register data is stored are the same. Thus, the size of the one-time PROM 120 can be reduced.

1-2. Second Embodiment

An electronic component 1 according to a second embodiment will now be described mainly in terms of its difference from the first embodiment, whereas configurations similar to those in the first embodiment are denoted by the same reference signs and descriptions similar to those in the first embodiment are omitted or simplified. The functional block diagram of the electronic component 1 according to the second embodiment is similar to FIG. 1. Therefore, its illustration and overlapping descriptions are omitted.

In the electronic component 1 according to the second embodiment, the one-time PROM 120 stores the first to m-th register addresses and first to m-th register data, as in the first embodiment. However, unlike in the first embodiment, the one-time PROM 120 does not store the first to n-th initial data, which are initial values of the first to n-th parameters. For example, the first register address RA1, the first register data RD1, the second register address RA2, the second register data RD2, . . . , the m-th register address RAm, and the m-th register data RDm may be stored in this order at the addresses 0 to m−1 in the one-time PROM 120.

In this embodiment, when the load signal LD turns active, the first to n-th initial data, each having a fixed value, are loaded in parallel into the first to n-th registers 131-1 to 131-$n$. After the first to n-th initial data are loaded in parallel into the first to n-th registers 131-1 to 131-$n$, the data transfer control circuit 110 acquires the i-th register address RAi and the i-th register data RDi from the one-time PROM 120 with respect to each integer i equal to or greater than 1 and equal to or smaller than m. The data transfer control circuit 110 transfers the i-th register data RDi to the k-th register 131-$k$ designated by the i-th register address RAi, and updates the k-th data held by the k-th register 131-$k$, with the i-th register data RDi. Here, k is an integer equal to or greater than 1 and equal to or smaller than n.

FIG. 6 illustrates the adjustment of the first to n-th parameters in the second embodiment.

In the example in FIG. 6, before the first adjustment, all-0, which is the predetermined data, is stored at all the addresses in the one-time PROM 120. In the example in FIG. 6, the storage area where no writing is done in the one-time PROM 120 has all-0. That is, in the first adjustment, data can be written at all the addresses in the one-time PROM 120.

In the first adjustment, the first to n-th parameters are set to the first to n-th initial data D1 to Dn. The first to n-th initial data D1 to Dn are, for example, representative values decided at the time designing or evaluating the electronic component 1.

When the second parameter should be changed from the second initial data D2 to data D2$a$ as a result of the first adjustment, a first register address RA1 representing the address 2 allocated to the second register 131-2 is written at the first writable address 0 in the one-time PROM 120. Also, first register data RD1 representing the data D2$a$ is written at the next writable address 2 in the one-time PROM 120.

Consequently, before the second adjustment, the first register address RA1 is stored at the address 0 and the first register data RD1 is stored at the address 1. Meanwhile, all-0, which is the predetermined data, is stored at the address 2 onward in the one-time PROM 120.

When the n-th parameter should be changed from the n-th initial data Dn to data Dn$a$ as a result of the second adjustment, a second register address RA2 representing the address n allocated to the n-th register 131-$n$ is written at the first writable address 2 in the one-time PROM 120. Also, second register data RD2 representing the data Dn$a$ is written at the next writable address 3 in the one-time PROM 120.

In the example in FIG. 6, after the adjustment is finished as the second adjustment is finished, the first register address RA1 is stored at the address 0 in the one-time PROM 120. The first register data RD1 is stored at the address 1. The second register address RA2 is stored at the address 2. The second register data RD2 is stored at the address 3. Meanwhile, all-0, which is the predetermined data, is stored at the address 4 onward in the one-time PROM 120.

In the example in FIG. 6, after the adjustment is finished, the two register addresses RA1, RA2 and the two register data RD1, RD2 are stored in the one-time PROM 120 and therefore the integer m is 2.

FIG. 7 shows an example of data transfer from the one-time PROM 120 to the register group 130 by the data transfer control circuit 110 in the second embodiment. In the example in FIG. 7, the content in the one-time PROM 120 is the same as the content after the adjustment in FIG. 6 is finished.

In the example in FIG. 7, based on the load signal LD, the data transfer control circuit 110 loads the first to n-th initial data D1 to Dn in parallel into the first to n-th registers 131-1 to 131-$n$. The first to n-th parameters are thus initialized to the first to n-th initial data D1 to Dn.

Subsequently, the data transfer control circuit 110 transfers the data D2$a$, which is the first register data RD1, stored at the address 1 in the one-time PROM 120, to the second register 131-2, to which the address 2 represented by the first register address RA1 stored at the address 0 in the one-time PROM 120 is allocated. The second parameter is thus updated to the data D2$a$. In this data transfer, the integer i is 1 and the integer k is 2.

Subsequently, the data transfer control circuit 110 transfers the data Dn$a$, which is the second register data RD2, stored at the address 3 in the one-time PROM 120, to the n-th register 131-$n$, to which the address n represented by the second register address RA2 stored at the address 2 in the one-time PROM 120 is allocated. The n-th parameter is thus updated to the data Dn$a$. In this data transfer, the integer i is 2 and the integer k is n.

The data transfer control circuit 110 then acquires the all-0, which is the predetermined data, stored at the address 4 in the one-time PROM 120, and ends the data transfer from the one-time PROM 120 to the register group 130. Subsequently, the electronic component 1 operates in the state where the functional element 200 is controlled by the first to n-th parameters held by the first to n-th registers 131-1 to 131-$n$.

Figure 8:
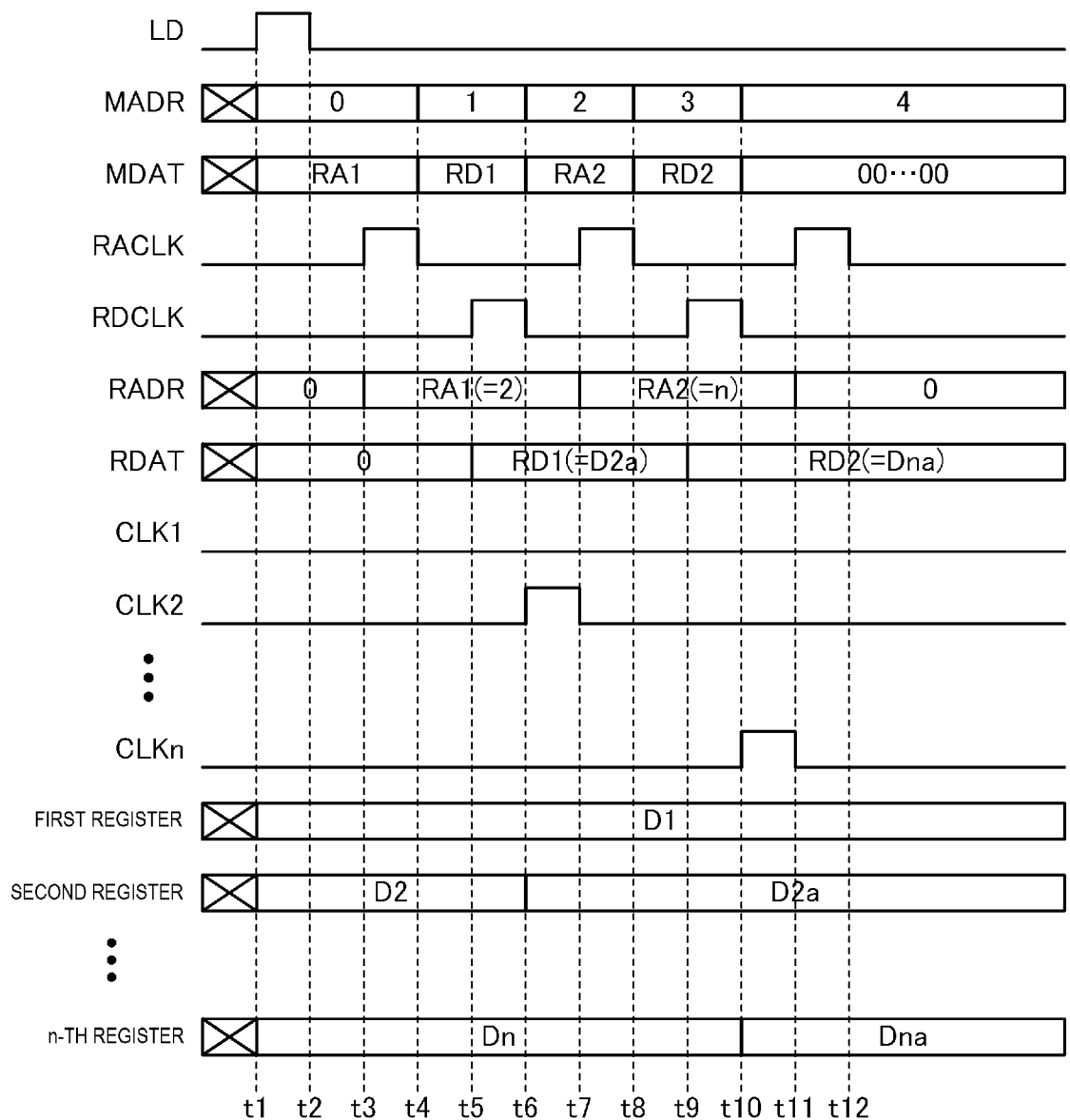
FIG. 8 shows an example of a timing chart of data transfer in the second embodiment.

FIG. 8 shows an example of a timing chart of various signals in the data transfer shown in FIG. 7.

In the example in FIG. 8, at time t1, the load signal LD changes from low level to high level. Thus, the memory address MADR outputted from the memory address generation circuit 111 is initialized to 0, and the first register address RA1 stored at the address 0 is outputted as the memory data MDAT from the one-time PROM 120. Also, the register address RADR held by the address register 112 and the register data RDAT held by the data register 113 are initialized to 0. The data held by the first to n-th registers 131-1 to 131-$n$ are initialized to the first to n-th initial data D1 to Dn.

At time t2, the load signal LD changes from high level to low level. Thus, at time t3, a clock signal RACLK changes from low level to high level. A clock signal RDCLK does not change and stays at low level.

The memory data MDAT is taken into the address register 112 and the register address RADR becomes the first register address RA1, synchronously with the rise of the clock signal RACLK at time t3.

At time t4, the memory address MADR is incremented from 0 to 1 and the first register data RD1 stored at the address 1 is outputted as the memory data MDAT from the one-time PROM 120. Also, the clock signal RACLK changes from high level to low level.

At time t5, the clock signal RDCLK changes from low level to high level. The memory data MDAT is taken into the data register 113 and the register data RDAT becomes the first register data RD1, synchronously with the rise of the clock signal RDCLK.

At time t6, the memory address MADR is incremented from 1 to 2 and the second register address RA2 stored at the address 2 is outputted as the memory data MDAT from the one-time PROM 120. Also, the clock signal RDCLK changes from high level to low level. Since the first register address RA1, which is the register address RADR, is 2, a clock signal CLK2 changes from low level to high level. The register data RDAT is taken into the second register 131-2 and the second parameter is updated to the data D2a, which is the first register data RD1, synchronously with the rise of the clock signal CLK2.

At time t7, the clock signal RACLK changes from low level to high level. The memory data MDAT is taken into the address register 112 and the register address RADR becomes the second register address RA2, synchronously with the rise of the clock signal RACLK. The clock signal CLK2 changes from high level to low level.

At time t8, the memory address MADR is incremented from 2 to 3 and the second register data RD2 stored at the address 3 is outputted as the memory data MDAT from the one-time PROM 120. The clock signal RACLK changes from high level to low level.

At time t9, the clock signal RDCLK changes from low level to high level. The memory data MDAT is taken into the data register 113 and the register data RDAT becomes the second register data RD2, synchronously with the rise of the clock signal RDCLK.

At time t10, the memory address MADR is incremented from 3 to 4 and the all-0, which is the predetermined data, stored at the address 4 is outputted as the memory data MDAT from the one-time PROM 120. Also, the clock signal RDCLK changes from high level to low level. Since the second register address RA2, which is the register address RADR, is n, a clock signal CLKn changes from low level to high level. The register data RDAT is taken into the n-th register 131-n and the n-th parameter is updated to the data Dna, which is the second register data RD2, synchronously with the rise of the clock signal CLKn.

At time t11, the clock signal RACLK changes from low level to high level. The memory data MDAT is taken into the address register 112 and the register address RADR becomes 0, synchronously with the rise of the clock signal RACLK. Also, the clock signal CLKn changes from high level to low level.

At time t12, the clock signal RACLK changes from high level to low level. Since the register address RADR is 0, the data transfer from the one-time PROM 120 to the register group 130 ends.

Figure 9:
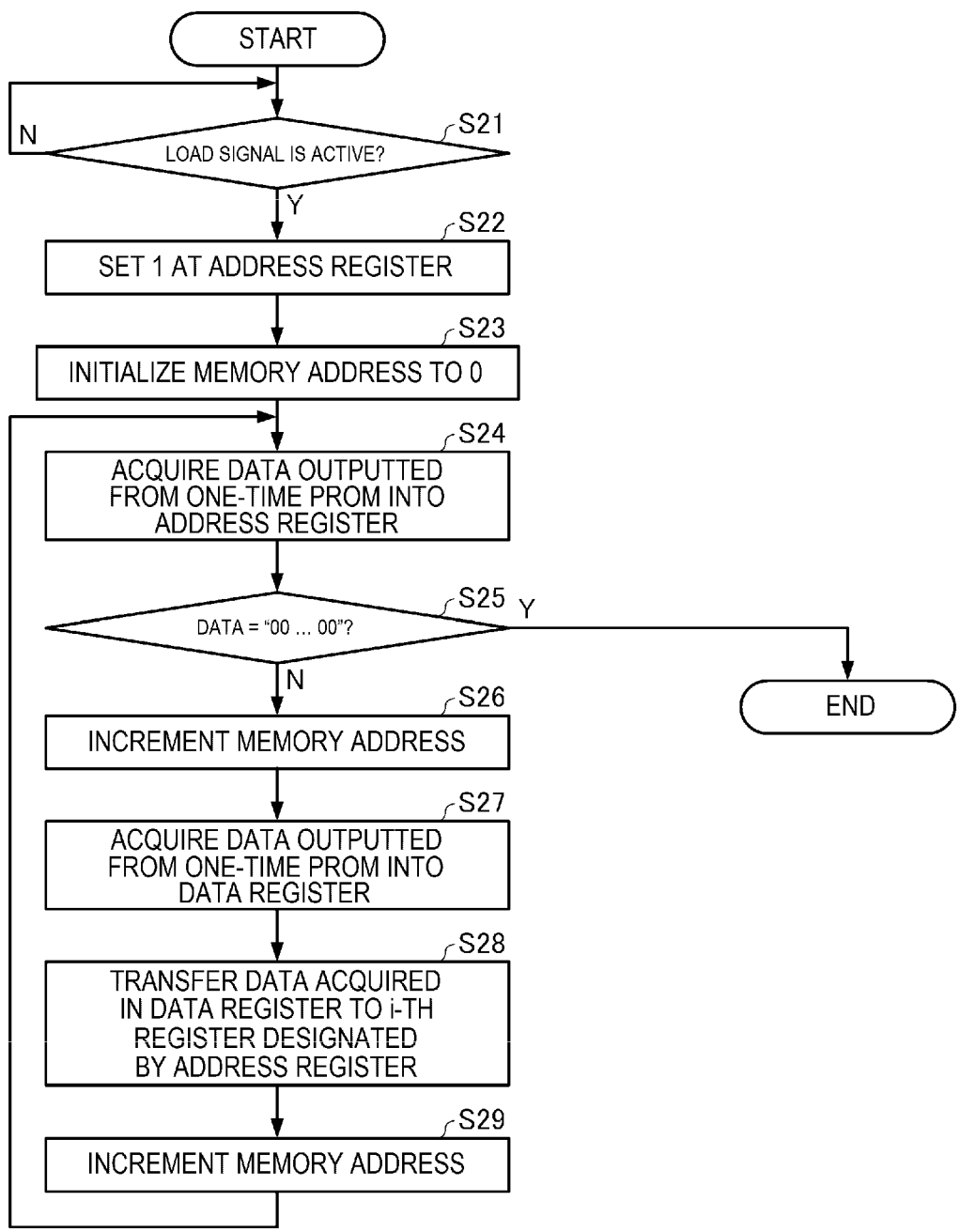
FIG. 9 is a flowchart showing an example of procedures of data transfer in the second embodiment.

FIG. 9 is a flowchart showing an example of processing procedures by the data transfer control circuit 110 in the second embodiment.

As shown in FIG. 9, the data transfer control circuit 110 waits until the load signal LD turns active (N in step S21). The load signal LD is active, for example, when it is at high level.

When the load signal LD is active (Y in step S21), the data transfer control circuit 110 first sets 1 at the address register 112 (step S22). Thus, the register address RADR becomes 1.

Next, the data transfer control circuit 110 initializes the memory address MADR to 0 (step S23) and acquires the memory data MDAT outputted from the one-time PROM 120 into the address register 112 (step S24). Thus, the register address RADR becomes the first register address RA1.

Next, when the data acquired into the address register 112 is not all-0, which is the predetermined data (N in step S25), the data transfer control circuit 110 increments the memory address MADR (step S26) and acquires the memory data MDAT outputted from the one-time PROM 120 into the data register 113 (step S27). Thus, the memory address MADR becomes 1 and the register data RDAT becomes the first register data RD1.

Next, the data transfer control circuit 110 transfers the data acquired in the data register 113 to the i-th register 131-i designated by the address register 112 (step S28). Thus, the i-th parameter is updated to the first register data RD1.

The data transfer control circuit 110 repeats the processing in step S24 onward. When the data acquired into the address register 112 in step S24 is all-0, which is the predetermined data (Y in step S25), the data transfer control circuit 110 ends the processing.

As described above, in the electronic component 1 according to the second embodiment, after the first to n-th initial data are loaded in parallel into the first to n-th registers 131-1 to 131-n, the data transfer control circuit 110 acquires the i-th register address RAi and the i-th register data RDi from the one-time PROM 120 with respect to each integer i equal to or greater than 1 and equal to or smaller than m. The data transfer control circuit 110 transfers the i-th register data RDi to the k-th register 131-k designated by the i-th register address RAi, and updates the k-th data held by the k-th register 131-k, with the i-th register data RDi. Thus, in the electronic component 1 or the data transfer circuit 100 according to the second embodiment, the one-time PROM 120 need not store the first to n-th initial data. Therefore, the size of the one-time PROM 120 can be reduced further.

Also, the electronic component 1 or the data transfer circuit 100 according to the second embodiment can achieve effects similar to those of the first embodiment.

1-3. Third Embodiment

An electronic component 1 according to a third embodiment will now be described mainly in terms of its difference from the first and second embodiments, whereas configurations similar to those in the first or second embodiment are denoted by the same reference signs and descriptions similar to those in the first or second embodiment are omitted or simplified. The functional block diagram of the electronic component 1 according to the third embodiment is similar to FIG. 1. Therefore, its illustration and overlapping descriptions are omitted.

In the electronic component 1 according to the third embodiment, the one-time PROM 120 stores the first to m-th register addresses and first to m-th register data and does not store the first to n-th initial data, which are initial values of the first to n-th parameters, as in the second embodiment. However, in the second embodiment, the address of the area where the i-th register address is stored and the address of the area where the i-th register data is stored, in the one-time PROM 120, are different from each other, with respect to each integer i equal to or greater than 1 and equal to or smaller than m, whereas in the third embodiment, the address of the area where the i-th register address is stored and the address of the area where the i-th register data is stored, in the one-time PROM 120, are the same with respect to each integer i equal to or greater than 1 and equal to or smaller than m. For example, the i-th register address RAi and the i-th register data RDi may be stored at an address i−1 in the one-time PROM 120.

In the third embodiment, as in the second embodiment, when the load signal LD turns active, the first to n-th initial data, each having a fixed value, are loaded in parallel into the first to n-th registers 131-1 to 131-n. After the first to n-th initial data are loaded in parallel into the first to n-th registers 131-1 to 131-n, the data transfer control circuit 110 acquires the i-th register address RAi and the i-th register data RDi from the one-time PROM 120 with respect to each integer i equal to or greater than 1 and equal to or smaller than m. The data transfer control circuit 110 transfers the i-th register data RDi to the k-th register 131-k designated by the i-th register address RAi, and updates the k-th data held by the k-th register 131-k, with the i-th register data RDi. Here, k is an integer equal to or greater than 1 and equal to or smaller than n.

FIG. 10 illustrates the adjustment of the first to n-th parameters in the third embodiment.

In the example in FIG. 10, before the first adjustment, all-0, which is the predetermined data, is stored at all the addresses in the one-time PROM 120. In the example in FIG. 10, the storage area where no writing is done in the one-time PROM 120 has all-0. That is, in the first adjustment, data can be written at all the addresses in the one-time PROM 120.

In the first adjustment, the first to n-th parameters are set to the first to n-th initial data D1 to Dn. The first to n-th initial data D1 to Dn are, for example, representative values decided at the time designing or evaluating the electronic component 1.

When the second parameter should be changed from the second initial data D2 to data D2a as a result of the first adjustment, a first register address RA1 representing the address 2 allocated to the second register 131-2 and first register data RD1 representing the data D2a are written at the first writable address 0 in the one-time PROM 120. In the example in FIG. 10, the first register address RA1 is written in high-order bytes of the address 0 and the first register data RD1 is written in low-order bytes of the address 0.

Consequently, before the second adjustment, the first register address RA1 and the first register data RD1 are stored at the address 0. Meanwhile, all-0, which is the predetermined data, is stored at the address 1 onward in the one-time PROM 120.

When the n-th parameter should be changed from the n-th initial data Dn to data Dna as a result of the second adjustment, a second register address RA2 representing the address n allocated to the n-th register 131-n and second register data RD2 representing the data Dna are written at the first writable address 1 in the one-time PROM 120. In the example in FIG. 10, the second register address RA2 is written in high-order bytes of the address 1 and the second register data RD2 is written in low-order bytes of the address 1.

In the example in FIG. 10, after the adjustment is finished as the second adjustment is finished, the first register address RA1 and the first register data RD1 are stored at the address 0 in the one-time PROM 120. The second register address RA2 and the second register data RD2 are stored at the address 1. Meanwhile, all-0, which is the predetermined data, is stored at the address 2 onward in the one-time PROM 120.

In the example in FIG. 10, after the adjustment is finished, the two register addresses RA1, RA2 and the two register data RD1, RD2 are stored in the one-time PROM 120 and therefore the integer m is 2.

Figure 11:
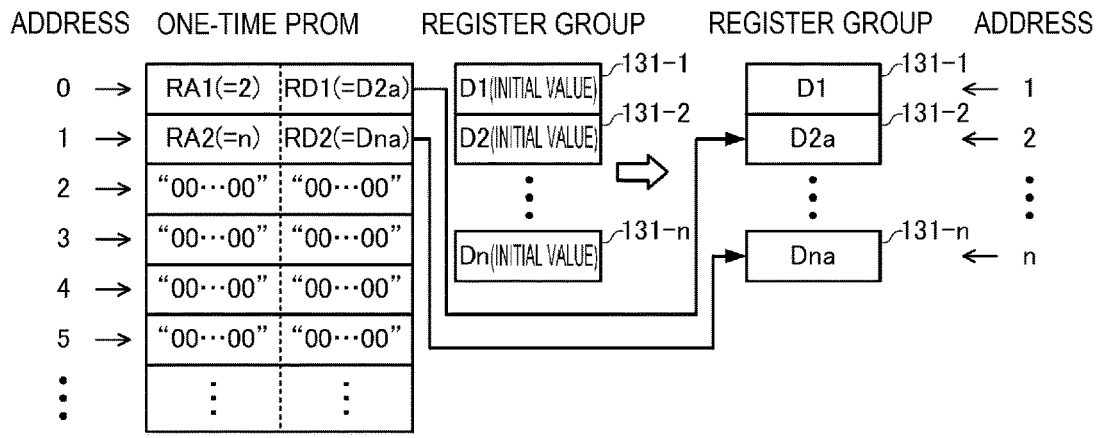
FIG. 11 shows an example of data transfer in the third embodiment.

FIG. 11 shows an example of data transfer from the one-time PROM 120 to the register group 130 by the data transfer control circuit 110 in the third embodiment. In the example in FIG. 11, the content in the one-time PROM 120 is the same as the content after the adjustment in FIG. 10 is finished.

In the example in FIG. 11, based on the load signal LD, the data transfer control circuit 110 loads the first to n-th initial data D1 to Dn in parallel into the first to n-th registers 131-1 to 131-n. The first to n-th parameters are thus initialized to the first to n-th initial data D1 to Dn.

Subsequently, the data transfer control circuit 110 transfers the data D2a, which is the first register data RD1, stored at the address 0 in the one-time PROM 120, to the second register 131-2, to which the address 2 represented by the first register address RA1 stored at the address 0 in the one-time PROM 120 is allocated. The second parameter is thus updated to the data D2a. In this data transfer, the integer i is 1 and the integer k is 2.

Subsequently, the data transfer control circuit 110 transfers the data Dna, which is the second register data RD2, stored at the address 1 in the one-time PROM 120, to the n-th register 131-n, to which the address n represented by the second register address RA2 stored at the address 1 in the one-time PROM 120 is allocated. The n-th parameter is thus updated to the data Dna. In this data transfer, the integer i is 2 and the integer k is n.

The data transfer control circuit 110 then acquires the all-0, which is the predetermined data, stored at the address 2 in the one-time PROM 120, and ends the data transfer from the one-time PROM 120 to the register group 130. Subsequently, the electronic component 1 operates in the state where the functional element 200 is controlled by the first to n-th parameters held by the first to n-th registers 131-1 to 131-n.

Figure 12:
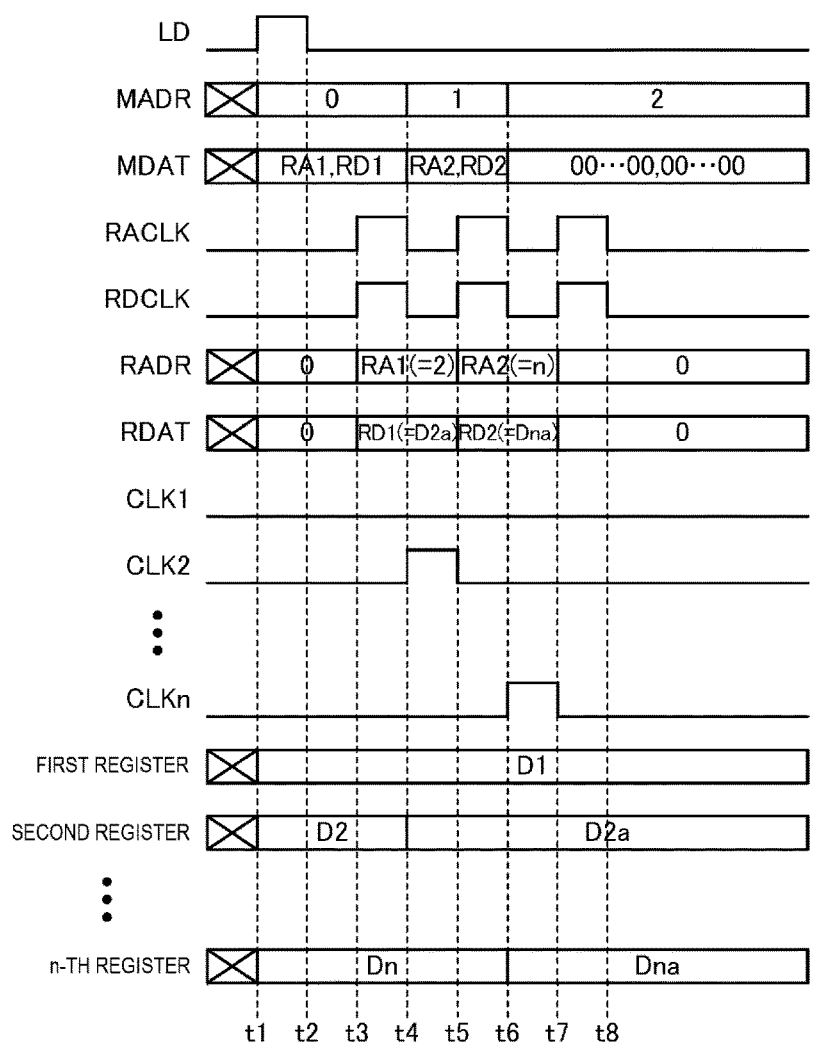
FIG. 12 shows an example of a timing chart of data transfer in the third embodiment.

FIG. 12 shows an example of a timing chart of various signals in the data transfer shown in FIG. 11.

In the example in FIG. 12, at time t1, the load signal LD changes from low level to high level. Thus, the memory address MADR outputted from the memory address generation circuit 111 is initialized to 0, and the first register address RA1 and the first register data RD1 stored at the address 0 are outputted as the memory data MDAT from the one-time PROM 120. Also, the register address RADR held by the address register 112 and the register data RDAT held by the data register 113 are initialized to 0. The data held by the first to n-th registers 131-1 to 131-n are initialized to the first to n-th initial data D1 to Dn.

At time t2, the load signal LD changes from high level to low level. Thus, at time t3, a clock signal RACLK and a clock signal RDCLK change from low level to high level.

The high-order bytes of the memory data MDAT are taken into the address register 112 and the register address RADR becomes the first register address RA1, synchronously with the rise of the clock signal RACLK at time t3. Also, the low-order bytes of the memory data MDAT are taken into the data register 113 and the register data RDAT becomes the first register data RD1, synchronously with the rise of the clock signal RDCLK at time t3.

At time t4, the memory address MADR is incremented from 0 to 1, and the second register address RA2 and the second register data RD2 stored at the address 1 are outputted as the memory data MDAT from the one-time PROM 120. Also, the clock signal RACLK and the clock signal RDCLK change from high level to low level. Since the first register address RA1, which is the register address RADR, is 2, a clock signal CLK2 changes from low level to high level. The register data RDAT is taken into the second register 131-2 and the second parameter is updated to the data D2a, which is the first register data RD1, synchronously with the rise of the clock signal CLK2.

At time t5, the clock signal RACLK changes from low level to high level. The high-order bytes of the memory data MDAT are taken into the address register 112 and the register address RADR becomes the second register address RA2, synchronously with the rise of the clock signal RACLK. Also, the clock signal RDCLK changes from low level to high level. The low-order bytes of the memory data MDAT are taken into the data register 113 and the register data RDAT becomes the second register data RD2, synchronously with the rise of the clock signal RDCLK. The clock signal CLK2 changes from high level to low level.

At time t6, the memory address MADR is incremented from 1 to 2 and the all-0, which is the predetermined data, stored at the address 2 is outputted as the memory data MDAT from the one-time PROM 120. Also, the clock signal RACLK and the clock signal RDCLK change from high level to low level. Since the second register address RA2, which is the register address RADR, is n, a clock signal CLKn changes from low level to high level. The register data RDAT is taken into the n-th register 131-n and the n-th parameter is updated to the data Dna, which is the second register data RD2, synchronously with the rise of the clock signal CLKn.

At time t7, the clock signal RACLK changes from low level to high level. The high-order bytes of the memory data MDAT are taken into the address register 112 and the register address RADR becomes 0, synchronously with the rise of the clock signal RACLK. Also, the clock signal RDCLK changes from low level to high level. The low-order bytes of the memory data MDAT are taken into the data register 113 and the register data RDAT becomes 0, synchronously with the rise of the clock signal RDCLK. The clock signal CLKn changes from high level to low level.

At time t8, the clock signal RACLK and the clock signal RDCLK change from high level to low level. Since the register address RADR is 0, the data transfer from the one-time PROM 120 to the register group 130 ends.

Figure 13:
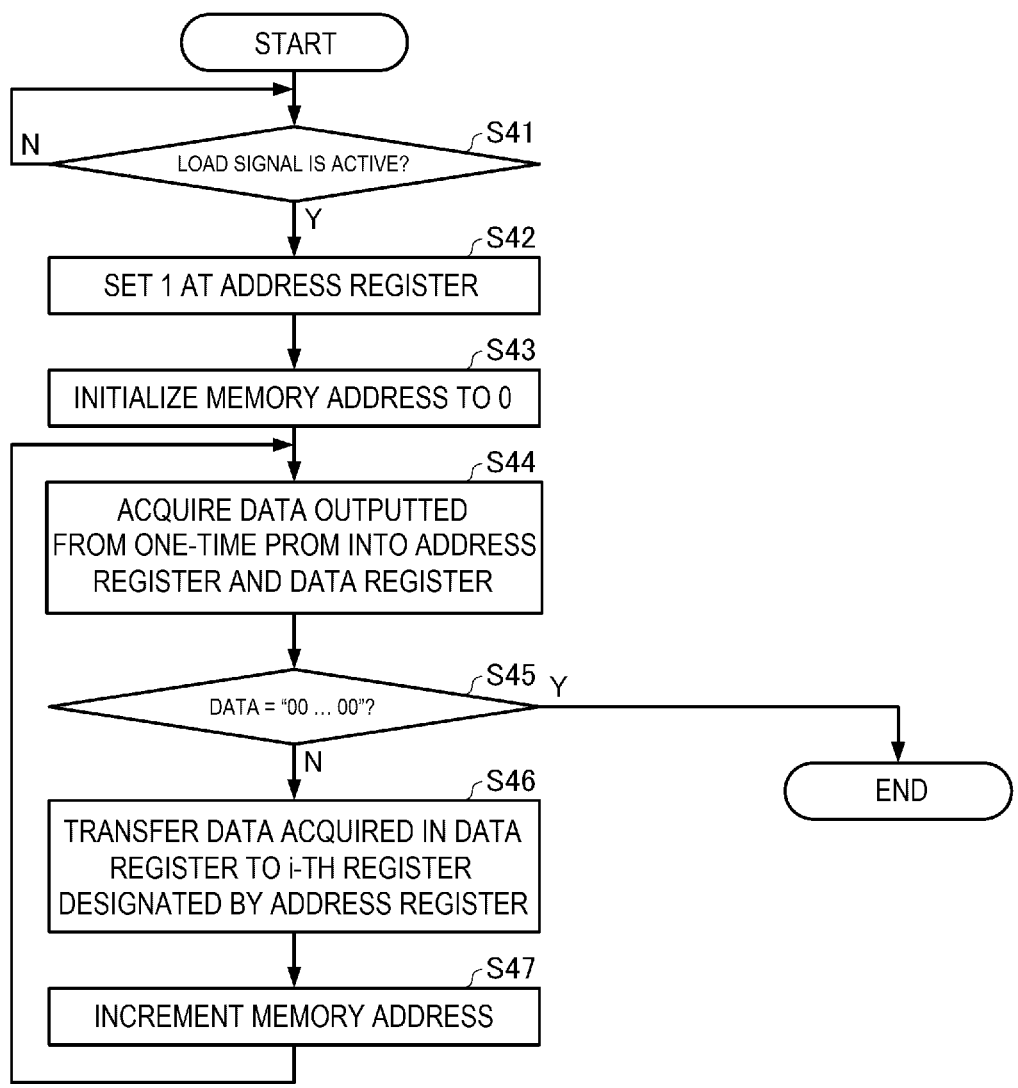
FIG. 13 is a flowchart showing an example of procedures of data transfer in the third embodiment.

FIG. 13 is a flowchart showing an example of processing procedures by the data transfer control circuit 110 in the third embodiment.

As shown in FIG. 13, the data transfer control circuit 110 waits until the load signal LD turns active (N in step S41). The load signal LD is active, for example, when it is at high level.

When the load signal LD is active (Y in step S41), the data transfer control circuit 110 first sets 1 at the address register 112 (step S42). Thus, the register address RADR becomes 1.

Next, the data transfer control circuit 110 initializes the memory address MADR to 0 (step S43) and acquires the memory data MDAT outputted from the one-time PROM 120 into the address register 112 and the data register 113 (step S44). Thus, the register address RADR becomes the first register address RA1. The register data RDAT becomes the first register data RD1.

Next, when the data acquired into the address register 112 is not all-0, which is the predetermined data (N in step S45), the data transfer control circuit 110 transfers the data acquired in the data register 113 to the i-th register 131-i designated by the address register 112 (step S46). Thus, the i-th parameter is updated to the first register data RD1.

Next, the data transfer control circuit 110 increments the memory address MADR (step S47). Thus, the memory address MADR becomes 1.

The data transfer control circuit 110 repeats the processing in step S44 onward. When the data acquired into the address register 112 in step S44 is all-0, which is the predetermined data (Y in step S45), the data transfer control circuit 110 ends the processing.

As described above, in the electronic component 1 according to the third embodiment, the address of the area where the i-th register address is stored and the address of the area where the i-th register data is stored are the same with respect to each integer i equal to or greater than 1 and equal to or smaller than m. Therefore, in the electronic component 1 or the data transfer circuit 100 according to the third embodiment, the number of times the data transfer control circuit 110 accesses the one-time PROM 120 is fewer than in the case where the address of the area where the i-th register address is stored and the address of the area where the i-th register data is stored are different from each other. Thus, the time of data transfer from the one-time PROM 120 to the first to n-th registers 131-1 to 131-n can be reduced.

Also, the electronic component 1 or the data transfer circuit 100 according to the third embodiment can achieve effects similar to those of the first or second embodiment.

1-4. Specific Examples

Figure 14:
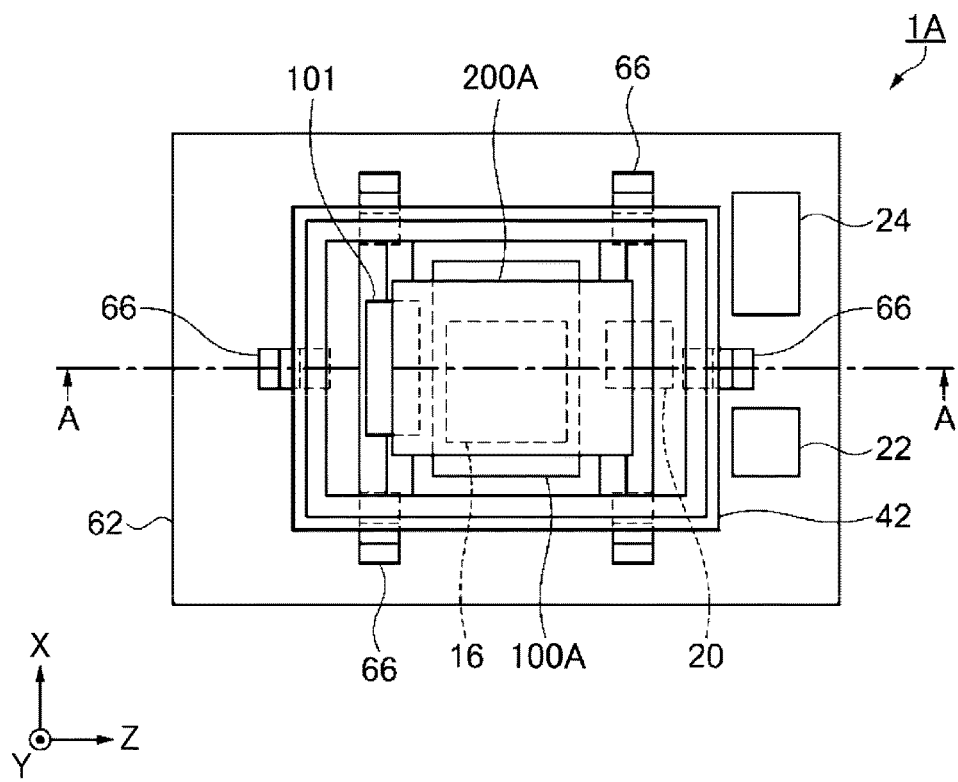
FIG. 14 is a plan view of an oscillator.
Figure 15:
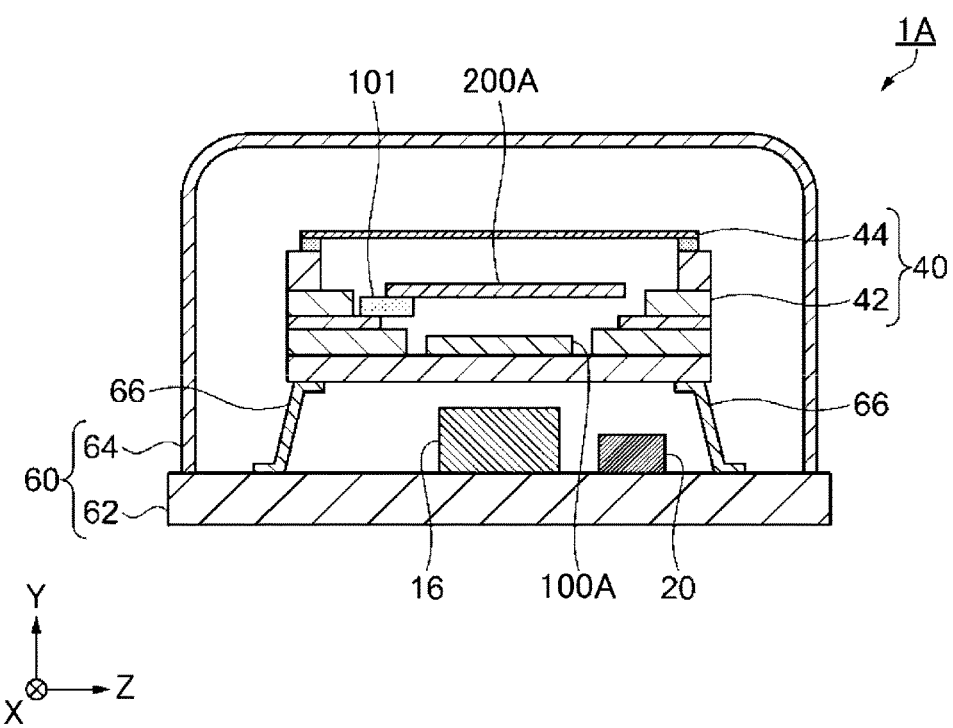
FIG. 15 is a cross-sectional view of the oscillator.
Figure 16:
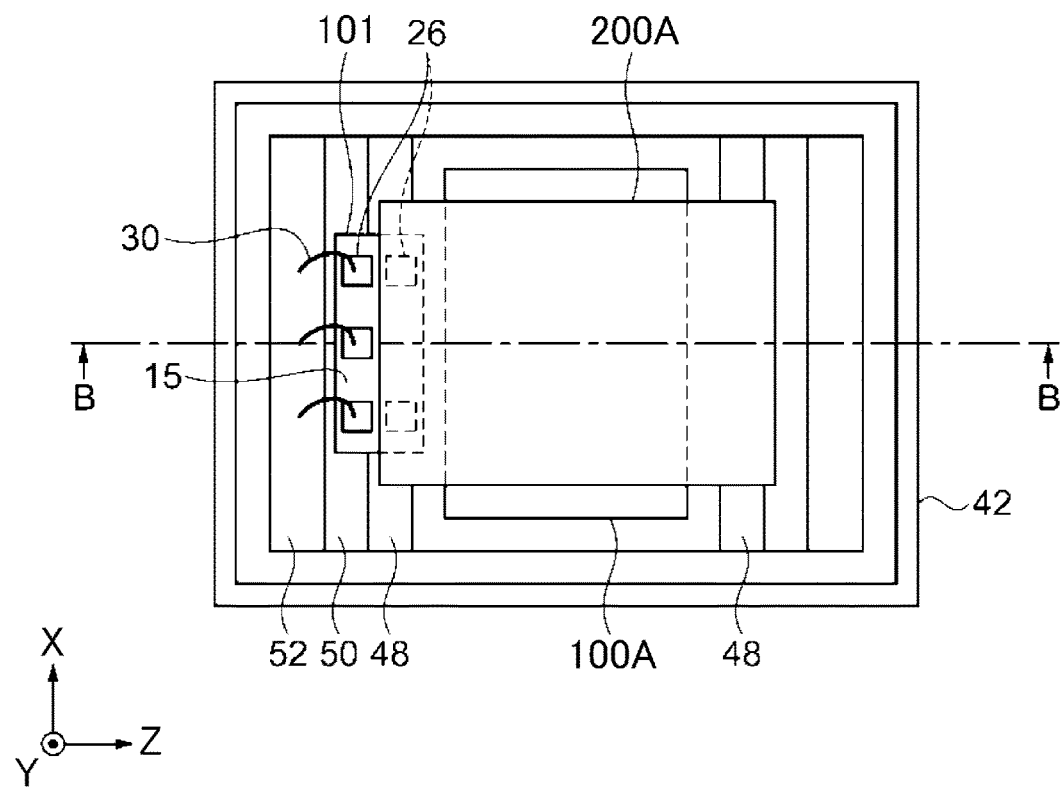
FIG. 16 is a plan view of a container forming the oscillator.
Figure 17:
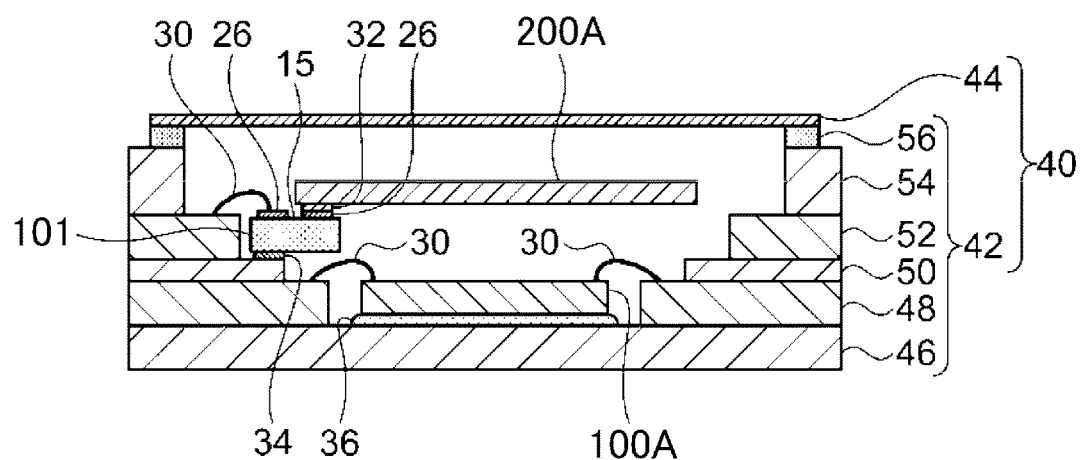
FIG. 17 is a cross-sectional view of the container forming the oscillator.

FIGS. 14 and 15 show the structure of an oscillator 1A, which is an example of the electronic component 1 according to the embodiments. FIG. 14 is a plan view of the oscillator 1A. FIG. 15 is a cross-sectional view taken along A-A in FIG. 14. FIGS. 16 and 17 show a schematic configuration of a container 40 forming the oscillator 1A. FIG. 16 is a plan view of the container 40 forming the oscillator 1A. FIG. 17 is a cross-sectional view taken along B-B in FIG. 16. FIGS. 14 and 16 show the state where a cover 64 and a lid member 44 are removed, for the sake of convenience in describing the internal configuration of the oscillator 1A and the container 40. Also, an X-axis, a Y-axis, and a Z-axis are shown in the illustrations as three axes orthogonal to each other, for the sake of convenience of the description. In a plan view seen in a direction along the Y-axis, the surface on the +Y side is referred to as an upper surface and the surface on the −Y side is referred to as a lower surface, for the sake of convenience of the description. Wiring patterns and electrode pads formed at the upper surface of a base substrate 62, coupling terminals formed on the outer surface of the container 40, and wiring patterns and electrode pads formed inside the container 40 are not shown in the illustrations.

As shown in FIGS. 14 and 15, the oscillator 1A includes: the container 40 accommodating therein a resonator element 200A, an integrated circuit 100A including an oscillation circuit, and an integrated circuit 101 including a temperature adjustment element; and a circuit element 16 arranged outside the container 40 and at the upper surface of the base substrate 62. The resonator element 200A may be, for example, an SC-cut quartz crystal resonator element. The SC-cut quartz crystal resonator element has a low external stress sensitivity and therefore has excellent frequency stability.

At the upper surface of the base substrate 62 of the oscillator 1A, the container 40 is spaced apart from the base substrate 62 via a lead frame 66, and circuit components 20, 22, 24 such as a plurality of capacitors and resistors are arranged. Also, the container 40 and the circuit element 16 are covered by a cover 64 and accommodated inside a container 60. The inside of the container 60 is airtightly sealed and kept in a reduced-pressure atmosphere such as vacuum or an inert gas atmosphere such as nitrogen, argon or helium.

The circuit element 16 and the circuit components 20, 22, 24 for adjusting the resonator element 200A or the oscillation circuit or the like included in the integrated circuit 100A are arranged outside the container 40 accommodating the integrated circuit 101. This prevents the generation of a gas from a resin member forming the circuit element 16 or a solder or electrically conductive adhesive or the like that is a coupling member between the circuit element 16 and the circuit components 20, 22, 24, and the container 40, due to the heat of the temperature adjustment element included in the integrated circuit 101. Also, since the resonator element 200A is accommodated in the container 40, even if a gas is generated, the frequency characteristic of the resonator element 200A can be kept stable without being affected by the gas and the oscillator 1A can achieve high frequency stability.

As shown in FIGS. 16 and 17, the integrated circuit 100A, the integrated circuit 101, and the resonator element 200A arranged at the upper surface of the integrated circuit 101 are accommodated inside the container 40. The inside of the container 40 is airtightly sealed and kept in a reduced-pressure atmosphere such as vacuum or an inert gas atmosphere such as nitrogen, argon or helium.

The container 40 is formed of a package main body 42 and a lid member 44. As shown in FIG. 17, the package main body 42 is formed of a first substrate 46, a second substrate 48, a third substrate 50, a fourth substrate 52, and a fifth substrate 54 stacked on each other. The second substrate 48, the third substrate 50, the fourth substrate 52, and the fifth substrate 54 are loop-shaped members with a center part removed. A sealing member 56 such as a seal ring or low-melting glass is formed at the peripheral edge of the upper surface of the fifth substrate 54.

The second substrate 48 and the third substrate 50 form a recess to accommodate the integrated circuit 100A. The fourth substrate 52 and the fifth substrate 54 form a recess to accommodate the integrated circuit 101 and the resonator element 200A.

The integrated circuit 100A is bonded via a bonding member 36 at a predetermined position on the upper surface of the first substrate 46. The integrated circuit 100A is electrically coupled via a bonding wire 30 to an electrode pad, not illustrated, arranged at the upper surface of the second substrate 48.

The integrated circuit 101 is bonded via a bonding member 34 at a predetermined position on the upper surface of the third substrate 50. An electrode pad 26 formed at an active surface 15, which is the upper surface of the integrated circuit 101, is electrically coupled via a bonding wire 30 to an electrode pad, not illustrated, arranged at the upper surface of the fourth substrate 52.

Since the integrated circuit 100A and the integrated circuit 101 are thus spaced apart from each other inside the container 40, the heat of the integrated circuit 101 heating the resonator element 200A is less likely to be transferred directly to the integrated circuit 100A. Therefore, deterioration in the characteristics of the oscillation circuit included in the integrated circuit 100A due to overheating can be controlled.

The resonator element 200A is arranged at the active surface 15 of the integrated circuit 101. Also, the electrode pad 26 formed at the active surface 15 and an electrode pad, not illustrated, formed at the lower surface of the resonator element 200A, are bonded to the integrated circuit 101 via a bonding member 32 such as a metal bump or electrically conductive adhesive. Thus, the resonator element 200A is supported by the integrated circuit 101. Excitation electrodes, not illustrated, formed at the upper and lower surfaces of the resonator element 200A, and an electrode pad, not illustrated, formed at the lower surface of the resonator element 200A, are electrically coupled. The resonator element 200A and the integrated circuit 101 may be coupled together in such a way that the heat generated in the integrated circuit 101 is transferred to the resonator element 200A. Therefore, for example, the resonator element 200A and the integrated circuit 101 may be coupled together by a bonding member that is not electrically conductive, and the resonator element 200A and the integrated circuit 101 or the package main body 42 may be electrically coupled via an electrically conductive member such as a bonding wire.

Since the resonator element 200A is arranged over the integrated circuit 101, the heat of the integrated circuit 101 can be transferred to the resonator element 200A without loss and the temperature control of the resonator element 200A can be stabilized further with less consumption.

In FIG. 14, the resonator element 200A is rectangular as viewed in a plan view seen in a direction along the Y-axis. However, the shape of the resonator element 200A is not limited to rectangular and may be, for example, circular. The resonator element 200A is not limited to an SC-cut quartz crystal resonator element and may be an AT-cut quartz crystal resonator element, a tuning fork-type quartz crystal resonator element, a surface acoustic wave resonator element or another piezoelectric resonator element, or an MEMS (micro-electromechanical systems) resonator element. When an AT-cut quartz crystal resonator element is used as the resonator element 200A, a B-mode suppression circuit is not needed. Therefore, the oscillator 1A can be reduced in size.

Figure 18:
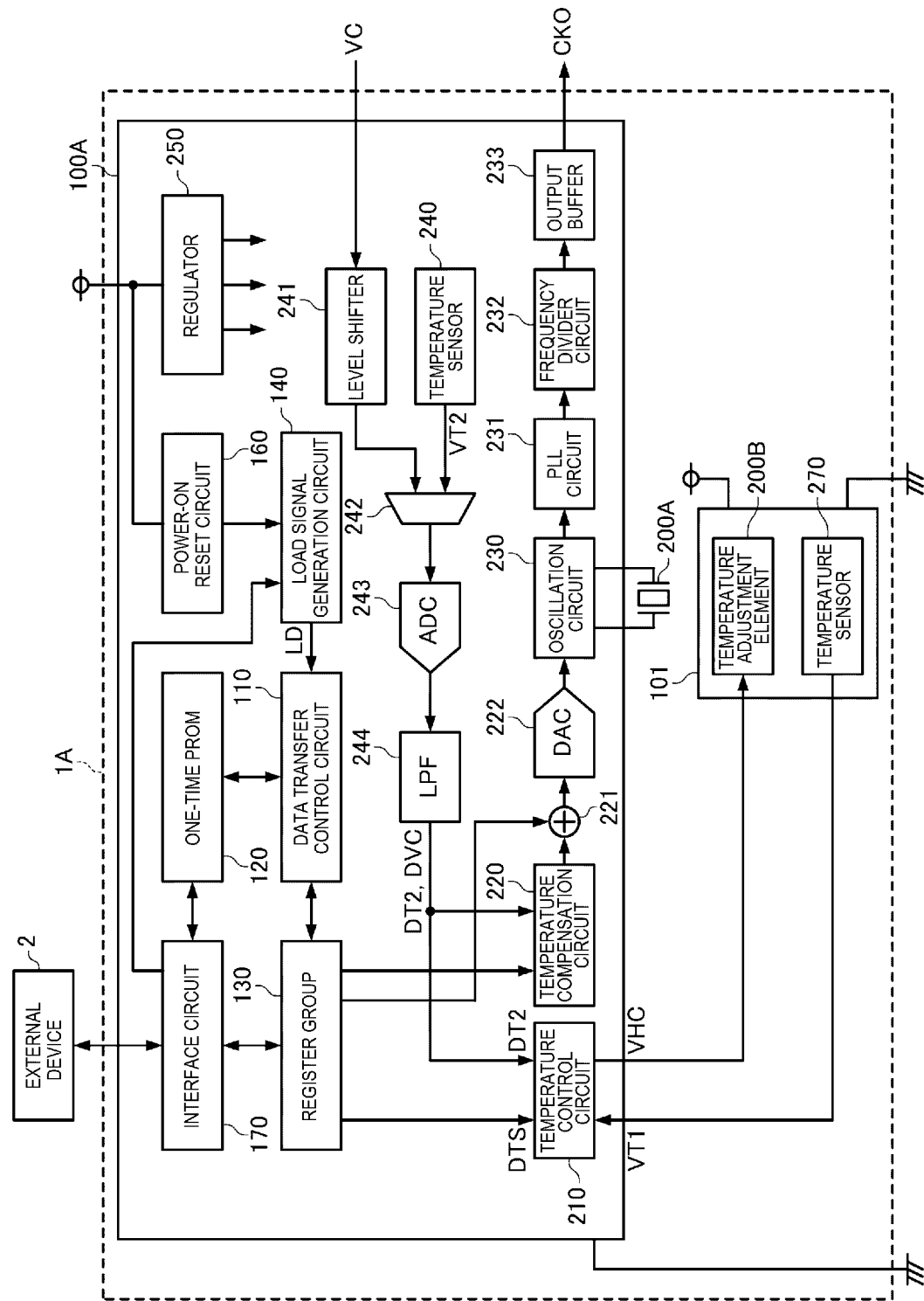
FIG. 18 is a functional block diagram of the oscillator.

FIG. 18 is a functional block diagram of the oscillator 1A. As shown in FIG. 18, the oscillator 1A includes the resonator element 200A, which is an example of the functional element 200, the integrated circuit 100A, and the integrated circuit 101.

The integrated circuit 101 includes a temperature adjustment element 200B and a temperature sensor 270.

The temperature adjustment element 200B, which is another example of the functional element 200, is an element adjusting the temperature of the resonator element 200A. The temperature adjustment element 200B is, for example, a heat generation element. The heat generated by the temperature adjustment element 200B is controlled according to a temperature control signal VHC supplied from the integrated circuit 100A. Since the resonator element 200A is bonded to the integrated circuit 101 as described above, the heat generated by the temperature adjustment element 200B is transferred to the resonator element 200A and the temperature of the resonator element 200A is adjusted to be closer to a desired constant temperature.

The temperature sensor 270 detects temperature and outputs a first temperature detection signal VT1 having a voltage level corresponding to the detected temperature. The resonator element 200A is bonded to the integrated circuit 101, as described above, and the temperature sensor 270 is located near the resonator element 200A. Therefore, the temperature sensor 270 detects the temperature in the peripheries of the resonator element 200A. Also, since the temperature sensor 270 is located near the temperature adjustment element 200B, it can be said that the temperature sensor 270 detects the temperature of the temperature adjustment element 200B. The first temperature detection signal VT1 outputted from the temperature sensor 270 is supplied to the integrated circuit 100A.

The integrated circuit 100A, which is an example of the data transfer circuit 100, includes the data transfer control circuit 110, the one-time PROM 120, the register group 130, the load signal generation circuit 140, a power-on reset circuit 160, an interface circuit 170, a temperature control circuit 210, a temperature compensation circuit 220, an adder circuit 221, a D/A converter circuit 222, an oscillation circuit 230, a PLL (phase-locked loop) circuit 231, a frequency divider circuit 232, an output buffer 233, a temperature sensor 240, a level shifter 241, a selector 242, an A/D converter circuit 243, a low-pass filter 244, and a regulator 250.

The power-on reset circuit 160 generates a reset signal that is active for a predetermined time, when the power of the electronic component 1 is switched on. This reset signal initializes each circuit in the integrated circuit 100A into a desired state.

The interface circuit 170 controls writing and reading of data to and from the one-time PROM 120 and the register group 130 by an external device 2 outside the oscillator 1A. The communication method between the external device 2 and the interface circuit 170 may be, for example, based on I²C (Inter-Integrated Circuit) or SPI (Serial Peripheral Interface).

As described above, the one-time PROM 120 is a nonvolatile memory that is rewritable only once at each address. The one-time PROM 120 stores first to m-th register addresses and first to m-th register data. Here, m is an integer equal to or greater than 1.

As described above, the register group 130 includes n registers made up of first to n-th registers. The first to n-th registers hold first to n-th data corresponding to first to n-th parameters controlling the operation of the resonator element 200A. One of the first to n-th parameters is a temperature compensation parameter for the oscillation circuit 230. Another one of the first to n-th parameters is a frequency adjustment parameter for the oscillation circuit 230.

In an inspection process at the time of manufacturing the oscillator 1A, the external device 2, which is an inspection device, writes the first to m-th register addresses and the first to m-th register data into the one-time PROM 120 via the interface circuit 170 and thus adjusts the first to n-th parameters. When a load signal LD is generated, the first to m-th register data stored in the one-time PROM 120 are respectively transferred to and held in one of the first to n-th registers included in the register group 130 via the data transfer control circuit 110. The first to n-th data held in the first to n-th registers are supplied to each circuit.

As described above, the load signal generation circuit 140 generates a load signal LD instructing the data transfer control circuit 110 to start data transfer from the one-time PROM 120 to the register group 130. For example, the load signal generation circuit 140 generates a load signal LD that is active for a predetermined time, in response to the reset signal generated by the power-on reset circuit 160 or a load command received by the interface circuit 170 from the external device 2.

As described above, the data transfer control circuit 110 performs control to transfer data stored in the one-time PROM 120 to the register group 130. Specifically, the data transfer control circuit 110 acquires the i-th register address and the i-th register data from the one-time PROM 120 with respect to each integer i equal to or greater than 1 and equal to or smaller than m. The data transfer control circuit 110 transfers the i-th register data to the k-th register designated by the i-th register address. The data transfer control circuit 110 updates the k-th data with the i-th register data. On receiving the load signal LD, the data transfer control circuit 110 starts data transfer from the one-time PROM 120 to the register group 130. The one-time PROM 120 stores predetermined data. On receiving the predetermined data from the one-time PROM 120, the data transfer control circuit 110 determines that the transfer of the first to m-th register data is finished. That is, when the data acquired at a predetermined timing from the one-time PROM 120 is not the predetermined data, the data transfer control circuit 110 determines that the data is the i-th register address, and transfers the i-th register data to the k-th register. When the acquired data is the predetermined data, the data transfer control circuit 110 determines that the transfer of the first to m-th register data is finished. For example, the data transfer control circuit 110 is implemented by the circuit shown in FIG. 1.

The regulator 250 generates a power-supply voltage or a reference voltage for each circuit provided in the integrated circuit 100A, based on a power-supply voltage supplied from outside the integrated circuit 100A.

The temperature sensor 240 detects temperature and outputs a second temperature detection signal VT2 having a voltage level corresponding to the detected temperature. As described above, the integrated circuit 100A is bonded to the upper surface of the first substrate 46, and the temperature sensor 240 is provided at a position further away from the resonator element 200A and the temperature adjustment element 200B than the temperature sensor 270. Therefore, the temperature sensor 240 detects the internal temperature of the container 40 at a position away from the resonator element 200A and the temperature adjustment element 200B. The heat of outside air is transferred to the container 40 via the lead frame 66. Therefore, when the temperature of the outside air of the oscillator 1A changes within a predetermined range, the temperature detected by the temperature sensor 270 provided near the temperature adjustment element 200B changes little, whereas the temperature detected by the temperature sensor 240 changes within a predetermined range.

The level shifter 241 converts a frequency control signal VC supplied from outside the oscillator 1A, to a desired voltage level.

The selector 242 selects and outputs one of the frequency control signal VC outputted from the level shifter 241 and the second temperature detection signal VT2 outputted from the temperature sensor 240. For example, the selector 242 selects and outputs the frequency control signal VC and the second temperature detection signal VT2 in time division. However, for example, in the inspection process at the time of manufacturing the oscillator 1A, a selection value for selecting one of the frequency control signal VC and the second temperature detection signal VT2 may be stored in the one-time PROM 120 according to the specifications of the oscillator 1A. Then, when the power of the oscillator 1A is switched on, this selection value may be transferred to and held in a predetermined register, not illustrated, included in the register group 130 from the one-time PROM 120 via the data transfer control circuit 110, and the selection value held in this register may be supplied to the selector 242.

The A/D converter circuit 243 converts the frequency control signal VC and the second temperature detection signal VT2, which are analog signals outputted in time division from the selector 242, into a frequency control value DVC and a second temperature detection value DT2, respectively, which are digital signals.

The low-pass filter 244 is a digital filter performing low-pass processing on the frequency control value DVC and the second temperature detection value DT2 outputted in time division from the A/D converter circuit 243 and thus reducing the intensity of a high-frequency noise signal.

The temperature control circuit 210 generates a temperature control signal VHC controlling the temperature adjustment element 200B, based on a temperature set value DTS of the resonator element 200A, the first temperature detection signal VT1, and the second temperature detection value DT2. The temperature set value DTS is a set value of target temperature of the resonator element 200A and is stored in the one-time PROM 120. For example, in the inspection process at the time of manufacturing the oscillator 1A, the temperature set value DTS that minimizes frequency change in relation to temperature change is generated and stored in the one-time PROM 120. When the power of the oscillator 1A is switched on, the temperature set value DTS is transferred to and held in a predetermined register, not illustrated, included in the register group 130 from the one-time PROM 120 via the data transfer control circuit 110, and the temperature set value DTS held in this register is supplied to the temperature control circuit 210.

The temperature compensation circuit 220 performs temperature compensation of the frequency of the oscillation circuit 230, based on the second temperature detection value DT2. Specifically, the temperature compensation circuit 220 generates a temperature compensation value which is a digital signal for temperature compensation to cause the frequency of the oscillation circuit 230 to be a desired frequency corresponding to the frequency control value DVC, based on the second temperature detection value DT2. For example, in the inspection process at the time of manufacturing the oscillator 1A, temperature compensation data for the temperature compensation circuit 220 to generate a temperature compensation value having substantially opposite characteristics of the frequency-temperature characteristics of the resonator element 200A is generated and stored in the one-time PROM 120. The temperature compensation data is data corresponding to the temperature compensation parameter. When the load signal LD is generated, the temperature compensation data is transferred to and held in a predetermined register, not illustrated, included in the register group 130 from the one-time PROM 120 via the data transfer control circuit 110, and the temperature compensation circuit 220 generates a temperature compensation value based on the temperature compensation data held in this register, the second temperature detection value DT2, and the frequency control value DVC.

The adder circuit 221 outputs a digital signal resulting from adding together the temperature compensation value generated by the temperature compensation circuit 220 and frequency adjustment data transferred to and held in a predetermined register, not illustrated, included in the register group 130 from the one-time PROM 120 via the data transfer control circuit 110. The frequency adjustment data is data corresponding to the frequency adjustment parameter and is adjusted for the oscillation circuit 230 to oscillate the resonator element 200A with a predetermined frequency at a predetermined temperature.

The D/A converter circuit 222 converts the digital signal outputted from the adder circuit 221 into an analog signal and supplies the analog signal to the oscillation circuit 230.

The oscillation circuit 230 is a circuit which is electrically coupled to both ends of the resonator element 200A and which amplifies an output signal from the resonator element 200A, feeds the amplified signal back to the resonator element 200A, and thus oscillates the resonator element 200A. For example, the oscillation circuit 230 may be an oscillation circuit using an inverter as an amplifier element, or an oscillation circuit using a bipolar transistor as an amplifier element.

The oscillation circuit 230 causes the oscillation frequency of the resonator element 200A to be closer to a constant value within a predetermined temperature range, based on the analog signal supplied from the D/A converter circuit 222. Specifically, the oscillation circuit 230 has a variable capacitance element, not illustrated, that serves as the load capacitance of the resonator element 200A. As an analog signal is supplied to the variable capacitance element, a load capacitance value corresponding to the voltage of the analog signal is obtained. Thus, the frequency of an oscillation signal outputted from the oscillation circuit 230 is temperature-compensated.

The PLL circuit 231 multiplies the frequency of the oscillation signal outputted from the oscillation circuit 230.

The frequency divider circuit 232 divides the frequency of the oscillation signal outputted from the PLL circuit 231.

The output buffer 233 buffers the oscillation signal outputted from the frequency divider circuit 232 and outputs an oscillation signal CKO to outside the integrated circuit 100A. This oscillation signal CKO becomes an output signal of the oscillator 1A.

The circuit including the temperature control circuit 210, the temperature compensation circuit 220, the D/A converter circuit 222, the oscillation circuit 230, the temperature sensor 240, the level shifter 241, the selector 242, the A/D converter circuit 243, and the low-pass filter 244 control the oscillation frequency and temperature or the like of the resonator element 200A and controls the amount of heat generation of the temperature adjustment element 200B, based on the first to n-th data held in the first to n-th registers included in the register group 130. That is, this circuit is an example of the functional element control circuit 150.

To minimize the frequency variation of the oscillation signal CKO, particularly the temperature set value DTS and the temperature compensation data stored in the one-time PROM 120 need to be adjusted to an optimal value in the inspection process at the time of manufacturing the oscillator 1A. For example, in the inspection process, the temperature set value DTS and the temperature compensation data are roughly adjusted in such a way that the frequency variation of the oscillation signal CKO falls within a predetermined range, and the temperature set value DTS and the temperature compensation data, thus adjusted, are written into the one-time PROM 120. In this state, the temperature set value DTS and the temperature compensation data are finely adjusted to an optimal value in such a way as to minimize the frequency variation of the oscillation signal CKO, and the temperature set value DTS and the temperature compensation data, thus adjusted, are written into the one-time PROM 120. When the fine adjustment of the temperature set value DTS to an optimal value does not minimize the frequency variation of the oscillation signal CKO, the temperature compensation data is finely adjusted again to an optimal value and then written into the one-time PROM 120. Similarly, when the fine adjustment of the temperature compensation data does not minimize the frequency variation of the oscillation signal CKO, the temperature set value DTS is finely adjusted again to an optimal value and then written into the one-time PROM 120.

In this way, in the oscillator 1A, at least one of many parameters can be written into the one-time PROM 120 a plurality of times. In the case where the one-time PROM 120 has a plurality of banks having a size large enough to store all the parameters, when at least one parameter needs to be rewritten, switching banks and writing all the parameters results in an increase in the size of the one-time PROM 120, making it difficult to install the one-time PROM 120 at the integrated circuit 100A. Thus, in this embodiment, every time one of the parameters needs to be rewritten, the address allocated to the register holding this parameter and new register data corresponding to this parameter are newly written into the one-time PROM 120. After the adjustment is finished, the one-time PROM 120 has the first to m-th register addresses and the first to m-th register data, as described above. Therefore, the one-time PROM 120 need not have a plurality of banks. Thus, the one-time PROM 120 has a small size and can be installed at the integrated circuit 100A.

As a specific example of the electronic component 1, the oscillator 1A having the temperature compensation function based on the second temperature detection value DT2 and the frequency control function based on the frequency control value DVC in addition to the temperature control function to adjust the temperature of the resonator element 200A to be closer to a target temperature is described above. However, the electronic component 1 may be an oscillator without having at least one of the temperature compensation function and the frequency control function. The electronic component 1 may also be a component other than an oscillator and may be, for example, an inertial sensor such as an angular velocity sensor or acceleration sensor.

2. Electronic Apparatus

Figure 19:
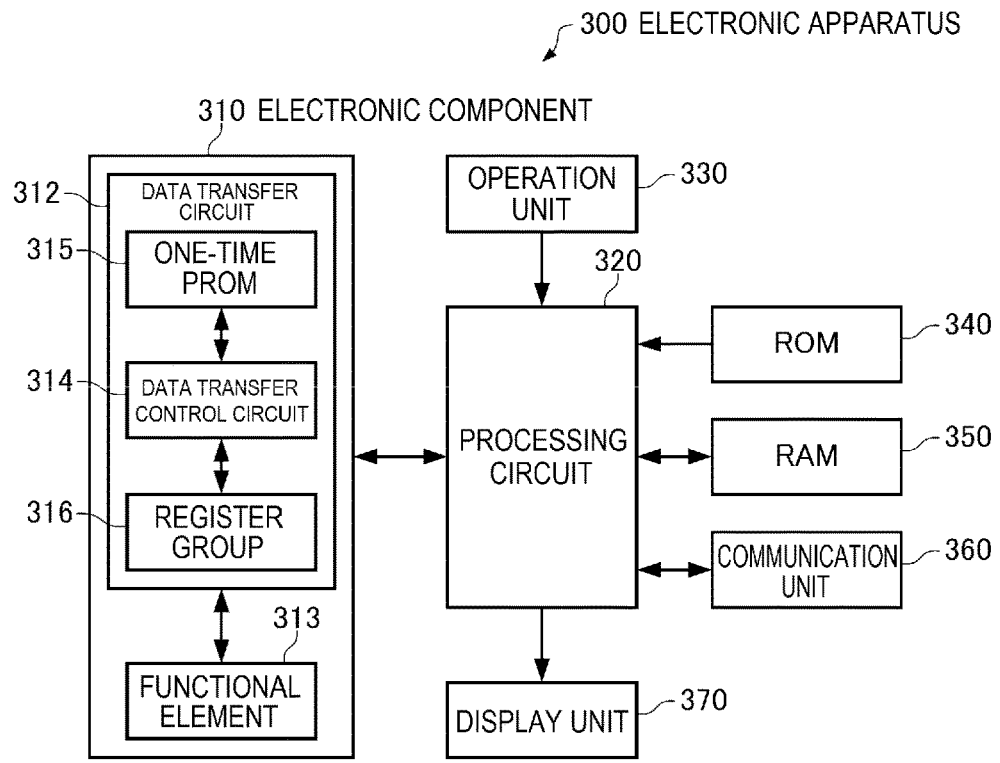
FIG. 19 is a functional block diagram of an electronic apparatus according to an embodiment.

FIG. 19 is a functional block diagram showing an example of the configuration of an electronic apparatus according to an embodiment.

An electronic apparatus 300 according to this embodiment includes an electronic component 310, a processing circuit 320, an operation unit 330, a ROM (read-only memory) 340, a RAM (random-access memory) 350, a communication unit 360, and a display unit 370. Also, as the electronic apparatus according to this embodiment, a part of the components shown in FIG. 19 may be omitted or changed, or another component may be added to the configuration in FIG. 19.

The electronic component 310 has a data transfer circuit 312 and a functional element 313. The data transfer circuit 312 includes a data transfer control circuit 314, a one-time PROM 315, and a register group 316.

The register group 316 includes n registers made up of first to n-th registers, not illustrated. The first to n-th registers hold first to n-th data corresponding to first to n-th parameters controlling the operation of the functional element 313.

The data transfer control circuit 314 performs control to transfer data stored in the one-time PROM 315 to the register group 316. Specifically, data transfer control circuit 314 acquires an i-th register address and i-th register data from the one-time PROM 315 with respect to each integer i equal to or greater than 1 and equal to or smaller than m. The data transfer control circuit 314 transfers the i-th register data to a k-th register designated by the i-th register address. The data transfer control circuit 314 updates k-th data with the i-th register data.

The one-time PROM 315 stores predetermined data. On acquiring the predetermined data from the one-time PROM 120, the data transfer control circuit 314 determines that the transfer of the first to m-th register data is finished. That is, when the data acquired at a predetermined timing from the one-time PROM 315 is not the predetermined data, the data transfer control circuit 314 determines that the data is the i-th register address, and transfers the i-th register data to the k-th register. When the acquired data is the predetermined data, the data transfer control circuit 314 determines that the transfer of the first to m-th register data is finished.

The functional element 313 is an element having a predetermined function and its operation is controlled by the data transfer circuit 312. The functional element 313 may be, for example, a resonator element having the function of oscillating at a desired frequency, or a physical quantity detection element having the function of detecting a desired physical quantity.

The electronic component 310 operates, based on the data stored in the one-time PROM 315, and outputs a desired signal to the processing circuit 320. For example, when the electronic component 310 is an oscillator, the electronic component 310 generates an oscillation signal and outputs the oscillation signal to the processing circuit 320.

The processing circuit 320 operates, based on the output signal from the electronic component 310. For example, the processing circuit 320 performs various kinds of calculation processing and control processing based on the signal inputted from the electronic component 310, according to a program stored in the ROM 340 or the like. Specifically, the processing circuit 320 performs various kinds of processing corresponding to an operation signal from the operation unit 330, processing of controlling the communication unit 360 in order to communicate data with an external device, processing of transmitting a display signal to cause the display unit 370 to display various kinds of information, and the like.

The operation unit 330 is an input device formed of operation keys, button switches and the like. The operation unit 330 outputs an operation signal corresponding to an operation by the user, to the processing circuit 320.

The ROM 340 is a storage unit storing a program and data or the like for the processing circuit 320 to perform various kinds of calculation processing and control processing.

The RAM 350 is a storage unit used as a work area by the processing circuit 320 and temporarily storing a program and data read out from the ROM 340, data inputted from the operation unit 330, results of computations executed by the processing circuit 320 according to various programs, and the like.

The communication unit 360 performs various kinds of control to establish data communication between the processing circuit 320 and an external device.

The display unit 370 is a display device formed of an LCD (liquid crystal display) or the like and displays various kinds of information, based on a display signal inputted from the processing circuit 320. The display unit 370 may be provided with a touch panel functioning as the operation unit 330.

Applying, for example, the electronic component 1 according to each of the foregoing embodiments as the electronic component 310 can realize, for example, a highly reliable electronic apparatus. The data transfer circuit 312 and the functional element 313 correspond to the data transfer circuit 100 and the functional element 200 in the embodiments, respectively.

As the electronic apparatus 300, various electronic apparatuses may be employed, for example, mobile, laptop or tablet personal computer, mobile terminal such as smartphone or mobile phone, digital still camera, inkjet ejection device such as inkjet printer, storage area network device such as router or switch, local area network device, mobile terminal base station device, television, video camera, video tape recorder, car navigation device, real-time clock device, pager, electronic organizer, electronic dictionary, electronic calculator, electronic game device, game controller, word processor, workstation, videophone, security monitor, electronic binoculars, POS terminal, medical equipment such as electronic body thermometer, blood pressure monitor, blood sugar monitor, electrocardiograph, ultrasonic diagnostic device or electronic endoscope, fishfinder, various measuring devices, instruments of vehicle, aircraft or ship, flight simulator, head-mounted display, motion tracing, motion tracking, motion controller, and pedestrian dead reckoning (PDR) device.

Figure 20:
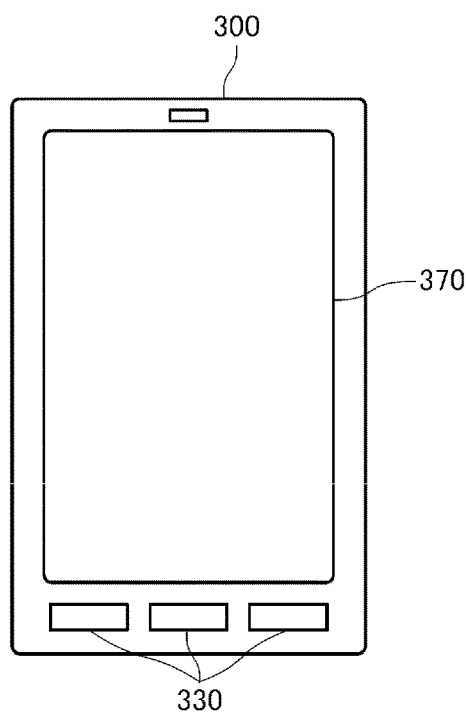
FIG. 20 shows an example of the external appearance of the electronic apparatus according to the embodiment.

FIG. 20 shows an example of the external appearance of a smartphone, which is an example of the electronic apparatus 300. The smartphone, as the electronic apparatus 300, has a button as the operation unit 330 and an LCD as the display unit 370. The smartphone, as the electronic apparatus 300, employs, for example, the electronic component 1 according to each of the foregoing embodiments as the electronic component 310 and thus can achieve high reliability.

3. Vehicle

Figure 21:
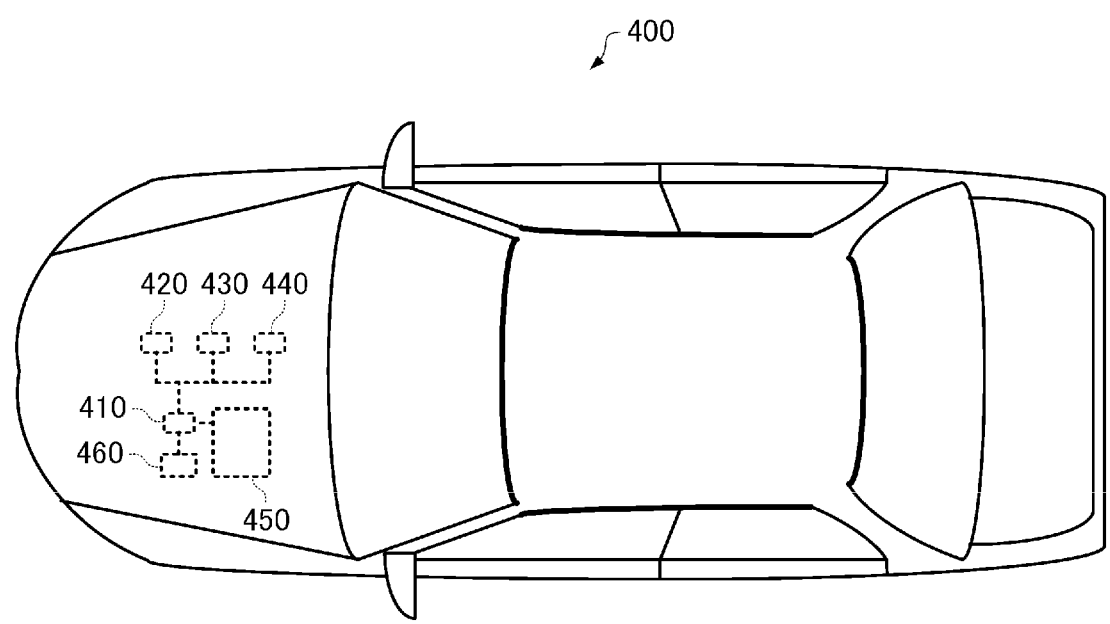
FIG. 21 shows an example of a vehicle according to an embodiment.

FIG. 21 shows an example of a vehicle according to an embodiment. A vehicle 400 shown in FIG. 21 includes an electronic component 410, processing circuits 420, 430, 440, a battery 450, and a backup battery 460. As the vehicle according to this embodiment, a part of the components shown in FIG. 21 may be omitted, or another component may be added to the configuration in FIG. 21.

The electronic component 410 has a data transfer circuit and a functional element, not illustrated. The data transfer circuit includes a data transfer control circuit, a one-time PROM, and a register group, not illustrated.

The register group includes n registers made up of first to n-th registers, not illustrated. The first to n-th registers hold first to n-th data corresponding to first to n-th parameters controlling the operation of the functional element.

The data transfer control circuit performs control to transfer data stored in the one-time PROM to the register group. Specifically, the data transfer control circuit acquires an i-th register address and an i-th register data from the one-time PROM with respect to each integer i equal to or greater than 1 and equal to or smaller than m. The data transfer control circuit transfers the i-th register data to a k-th register designated by the i-th register address. The data transfer control circuit updates k-th data with the i-th register data.

The one-time PROM stores predetermined data. On acquiring the predetermined data from the one-time PROM, the data transfer control circuit determines that the transfer of the first to m-th register data is finished. That is, when the data acquired at a predetermined timing from the one-time PROM is not the predetermined data, the data transfer control circuit determines that the data is the i-th register address, and transfers the i-th register data to the k-th register. When the acquired data is the predetermined data, the data transfer control circuit determines that the transfer of the first to m-th register data is finished.

The functional element is an element having a predetermined function and its operation is controlled by the data transfer circuit. The functional element may be, for example, a resonator element having the function of oscillating at a desired frequency, or a physical quantity detection element having the function of detecting a desired physical quantity.

The electronic component 410 operates, based on the data stored in the one-time PROM, and outputs a desired signal to the processing circuits 420, 430, 440. For example, when the electronic component 410 is an oscillator, the electronic component 410 generates an oscillation signal and outputs the oscillation signal to the processing circuits 420, 430, 440.

The processing circuits 420, 430, 440 operate, based on the output signal from the electronic component 410, and performs various kinds of control on an engine system, a brake system, a keyless entry system or the like.

The battery 450 supplies electric power to the electronic component 410 and the processing circuits 420, 430, 440. The backup battery 460 supplies electric power to the electronic component 410 and the processing circuits 420, 430, 440 when the output voltage of the battery 450 has dropped below a threshold.

Applying, for example, the electronic component 1 according to each of the foregoing embodiments as the electronic component 410 can realize, for example, a highly reliable vehicle. The data transfer circuit and the functional element of the electronic component 410 correspond to the data transfer circuit 100 and the functional element 200 in the embodiments, respectively.

As the vehicle 400, various vehicles may be employed, for example, an automobile such as electric vehicle, aircraft such as jet plane or helicopter, ship, rocket, and artificial satellite.

The present disclosure is not limited to the embodiments and can be carried out with various modifications without departing from the spirit and scope of the present disclosure.

The embodiments and modifications are examples and not limiting. For example, the respective embodiments and modifications can be combined together according to need.

The present disclosure includes a configuration substantially the same as any of the configurations described in the embodiments, for example, a configuration having the same function, method, and effect, or a configuration having the same object and effect. The present disclosure also includes a configuration resulting from replacing a non-essential part of any of the configurations described in the embodiments. The present disclosure also includes a configuration achieving the same advantageous effect or the same object as any of the configurations described in the embodiments. The present disclosure also includes a configuration resulting from adding a known technique to any of the configurations described in the embodiments.

What is claimed is:

1. A data transfer circuit comprising:
a one-time programmable read-only memory (PROM) storing first to m-th register addresses and first to m-th register data, m being an integer equal to or greater than 1;
first to n-th registers holding first to n-th data corresponding to first to n-th parameters controlling an operation of a functional element, n being an integer equal to or greater than 2; and a data transfer control circuit acquiring, with respect to each integer i equal to or greater than 1 and equal to or smaller than m, the i-th register address and the i-th register data from the one-time PROM, transferring the i-th register data to the k-th register designated by the i-th register address, k being an integer equal to or greater than 1 and equal to or smaller than n, and updating the k-th data with the i-th register data.

2. The data transfer circuit according to claim 1, wherein the one-time PROM stores first to n-th initial data which are initial values of the first to n-th parameters, and the data transfer control circuit transfers the i-th register data to the k-th register after acquiring the first to n-th initial data from the one-time PROM and transferring the first to n-th initial data to the first to n-th registers.

3. The data transfer circuit according to claim 1, wherein the data transfer control circuit transfers the i-th register data to the k-th register after first to n-th initial data which are initial values of the first to n-th parameters are loaded in parallel to the first to n-th registers.

4. The data transfer circuit according to claim 1, wherein the one-time PROM stores predetermined data, the data transfer control circuit determines that transfer of the first to m-th register data is finished, on acquiring the predetermined data from the one-time PROM.

5. The data transfer circuit according to claim 1, wherein an address of an area where the i-th register address is stored and an address of an area where the i-th register data is stored, in the one-time PROM, are different from each other.

6. The data transfer circuit according to claim 1, wherein an address of an area where the i-th register address is stored and an address of an area where the i-th register data is stored in the one-time PROM are the same.

7. The data transfer circuit according to claim 1, wherein the functional element is a resonator element, the data transfer circuit has an oscillation circuit oscillating the resonator element, and one of the first to n-th parameters is a temperature compensation parameter for the oscillation circuit, and another one of the first to n-th parameters is a frequency adjustment parameter for the oscillation circuit.

8. An electronic component comprising:

the data transfer circuit according to claim 1; and the functional element.

9. An electronic apparatus comprising:

the electronic component according to claim 8; and a processing circuit operating based on an output signal from the electronic component.

10. A vehicle comprising:

the electronic component according to claim 8; and a processing circuit operating based on an output signal from the electronic component.

* * * * *